(12) United States Patent
Sharma et al.

(10) Patent No.: US 11,586,966 B2
(45) Date of Patent: Feb. 21, 2023

(54) DEVELOPMENT AND ANALYSIS OF QUANTUM COMPUTING PROGRAMS

(71) Applicant: International Business Machines Corporation, Armonk, NY (US)

(72) Inventors: Sanjana Arun Sharma, Cambridge, MA (US); Anna Obikane, New York, NY (US); Francisco José Cabrera Hernández, Tacoronte (ES); Jay M. Gambetta, Yorktown Heights, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 1113 days.

(21) Appl. No.: 16/210,612

(22) Filed: Dec. 5, 2018

(65) Prior Publication Data

US 2020/0104739 A1 Apr. 2, 2020

(30) Foreign Application Priority Data

Sep. 27, 2018 (ES) .............................. ESEP18382686

(51) Int. Cl.
*G06N 10/00* (2022.01)
*G06F 16/904* (2019.01)
(Continued)

(52) U.S. Cl.
CPC ........... *G06N 10/00* (2019.01); *G06F 9/3877* (2013.01); *G06F 9/5027* (2013.01); *G06F 15/16* (2013.01);
(Continued)

(58) Field of Classification Search
CPC ...... G06N 10/00; G06N 10/80; G06F 9/3877; G06F 9/5027; G06F 15/16;
(Continued)

(56) References Cited

U.S. PATENT DOCUMENTS

| | | |
|---|---|---|
| 7,353,148 B1 | 4/2008 | Meyers et al. |
| 9,477,796 B2 | 10/2016 | Garcia-Ramirez et al. |
| 10,044,638 B2 | 8/2018 | Dadashikelayeh et al. |

(Continued)

OTHER PUBLICATIONS

Invitation to pay additional fees received for PCT Application Serial No. PCT/EP2019/075738 dated Dec. 20, 2019, 12 pages.
(Continued)

*Primary Examiner* — James C Kerveros
(74) *Attorney, Agent, or Firm* — Amin, Turocy & Watson, LLP

(57) ABSTRACT

Techniques regarding the development and/or analysis of one or more quantum computing programs are provided. For example, one or more embodiments described herein can comprise a system, which can comprise a memory that can store computer executable components. The system can also comprise a processor, operably coupled to the memory, and that can execute the computer executable components stored in the memory. The computer executable components can comprise a circuit component, operatively coupled to the processor, that can create a quantum computing program over a period of time. The computer executable components can also comprise a visualization component, operatively coupled to the processor, that can generates a quantum state visualization that depicts a characterization of the quantum computing program over the period of time.

25 Claims, 20 Drawing Sheets

(51) Int. Cl.
  *G06F 16/901* (2019.01)
  *G06F 30/33* (2020.01)
  *G06F 9/38* (2018.01)
  *G06F 9/50* (2006.01)
  *G06F 15/16* (2006.01)
  *G06N 10/80* (2022.01)

(52) U.S. Cl.
  CPC ........ *G06F 16/904* (2019.01); *G06F 16/9024* (2019.01); *G06F 30/33* (2020.01); *G06N 10/80* (2022.01)

(58) Field of Classification Search
  CPC .... G06F 16/9024; G06F 16/904; G06F 30/33; G06F 2209/5013; G06F 30/30
  USPC .......................................................... 703/22
  See application file for complete search history.

(56) References Cited

U.S. PATENT DOCUMENTS

| | | | | |
|---|---|---|---|---|
| 2003/0169041 | A1* | 9/2003 | Coury | G06N 10/00 324/307 |
| 2005/0182614 | A1* | 8/2005 | Meredith | B82Y 10/00 257/14 |
| 2018/0046933 | A1* | 2/2018 | La Cour | G06F 12/023 |
| 2018/0246848 | A1 | 8/2018 | Douglass et al. | |
| 2020/0301562 | A1* | 9/2020 | Gupta | G06F 9/455 |

OTHER PUBLICATIONS

Michielsen et al., "QCE: A Simulator for Quantum Computer Hardware", Turkish Journal Of Physics, vol. 27, No. 5, Sep. 1, 2003, pp. 343-370.

International Search Report and Written Opinion received for PCT Application Serial No. PCT/EP2019/075738 dated Feb. 17, 2020, 16 pages.

Huo, Changming. "A Bloch Sphere Animation Software using a Three Dimensional Java Simulator." Division of Research and Advanced Studies of the University of Cincinnati, Aug. 2009. 125 pages.

Karafyllidis, Ioannis G. "Quantum Computer Simulator Based on the Circuit Model of Quantum Computation." IEEE Transactions on Circuits and Systems—I: Regular Papers, vol. 52, No. 8, Aug. 2005. 7 pages.

"Quantum Computing Playground." Google. https://github.com/gwroblew/Quantum-Computing-Playground. 4 pages.

"IBM Q. Experience." https://quantumexperience.ng.bluemix.net/qx/editor. Last Accessed Sep. 11, 2018. 1 page.

"Quantum Simulator GUI." http://algassert.com/quirk. Last Accessed Sep. 11, 2018. 1 page.

"Quantum Inspire." https://www.quantum-inspire.com/projects/833. Last Accessed Sep. 13, 2018. 1 page.

Mell, Peter, et al. "The NIST Definition of Cloud Computing." National Institute of Standards and Technology. Sep. 2011. 7 pages.

* cited by examiner

FIG. 10

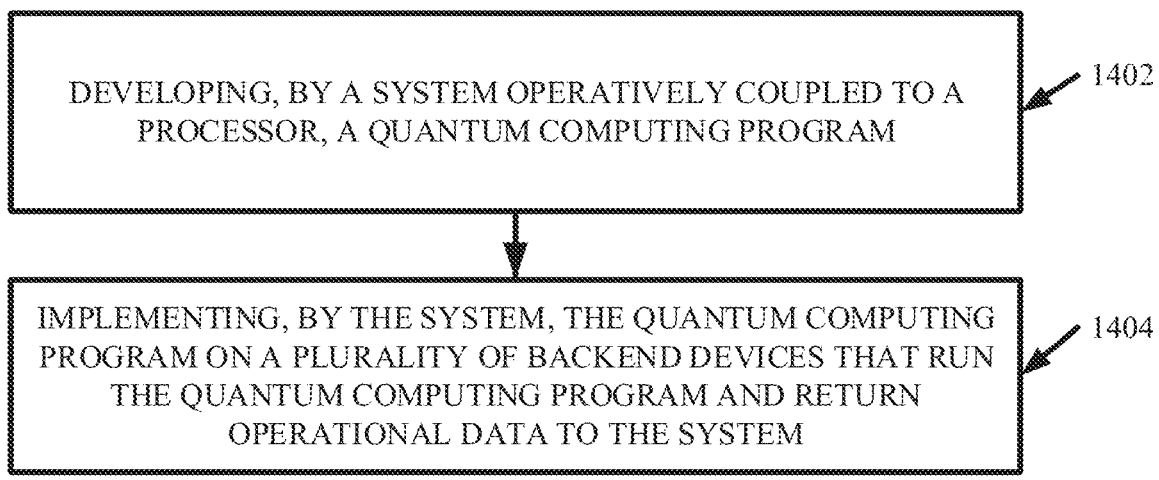

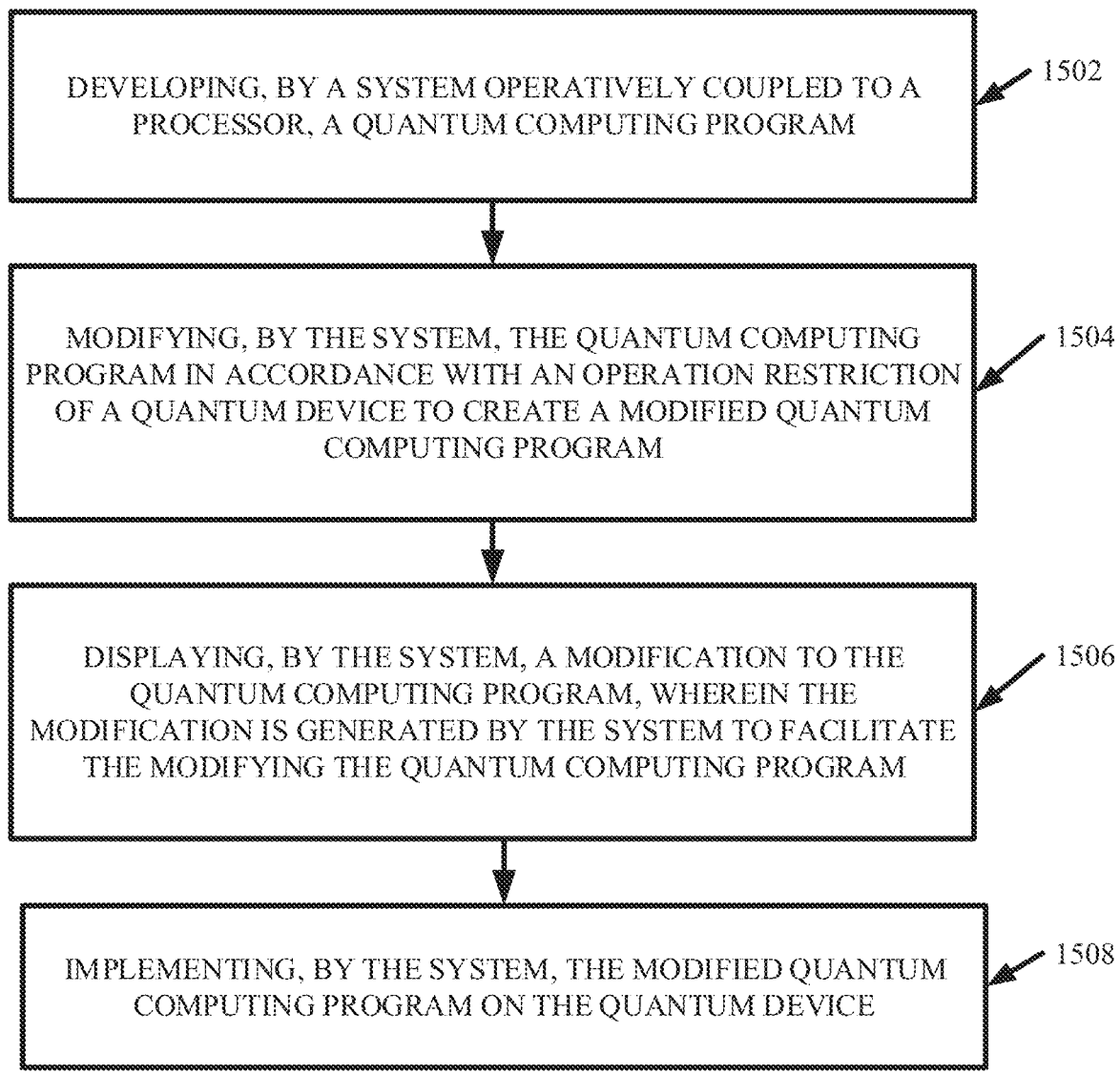

```
┌─────────────────────────────────────────────────────┐
│ IMPLEMENTING, BY A SYSTEM OPERATIVELY COUPLED TO A  │
│ PROCESSOR, A QUANTUM COMPUTING PROGRAM ON A         │──◄── 1602
│ BACKEND DEVICE THAT RETURNS OPERATIONAL DATA        │
│ REGARDING THE QUANTUM COMPUTING PROGRAM TO THE      │
│ SYSTEM                                              │
└─────────────────────────────────────────────────────┘
                            │
                            ▼
┌─────────────────────────────────────────────────────┐
│ STORING, BY THE SYSTEM, THE OPERATIONAL DATA        │──◄── 1604
│ REGARDING THE QUANTUM COMPUTING PROGRAM IN A        │
│ DATABASE ARCHIVE                                    │
└─────────────────────────────────────────────────────┘
```

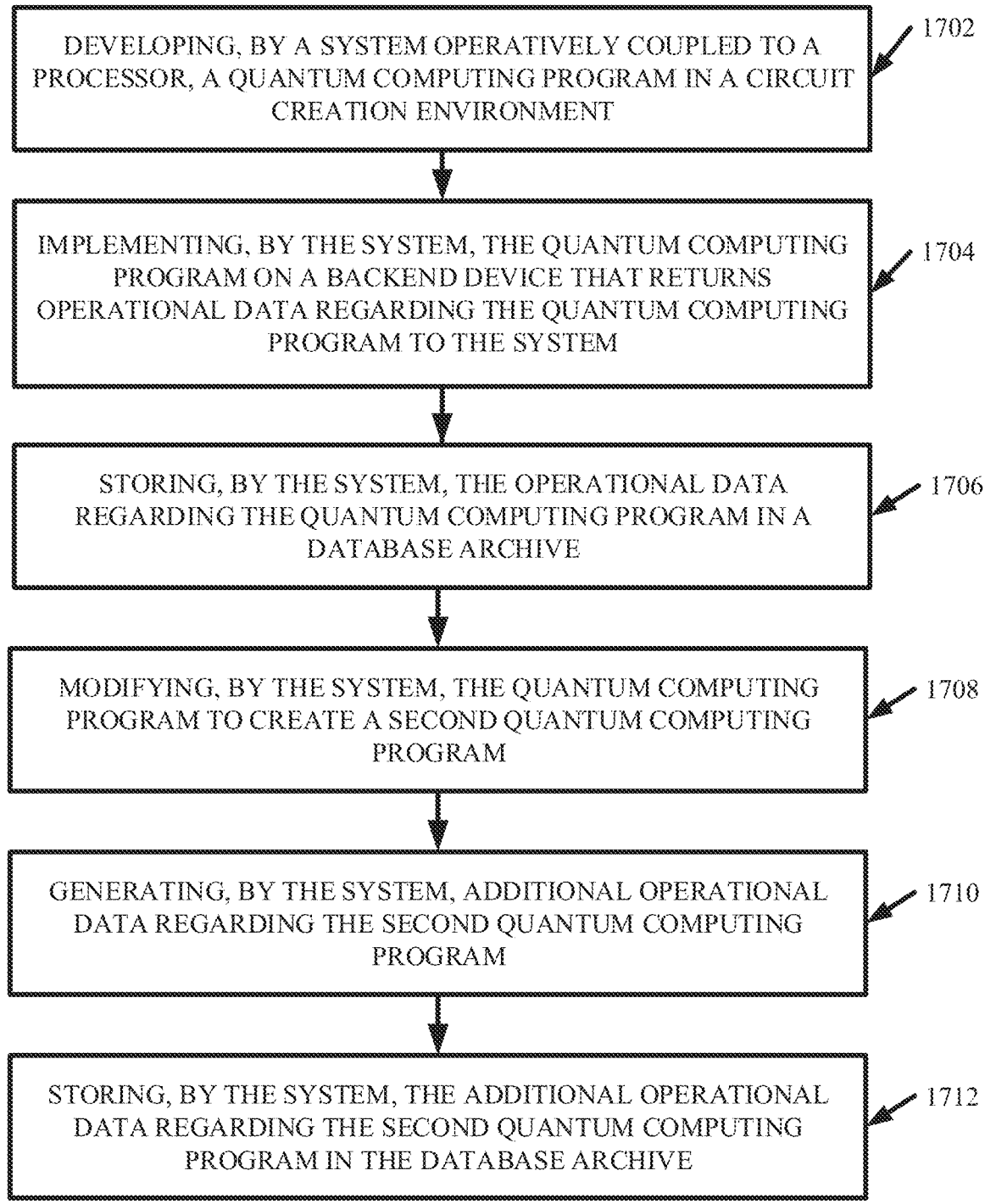

DEVELOPMENT AND ANALYSIS OF QUANTUM COMPUTING PROGRAMS

BACKGROUND

The subject disclosure relates to quantum computing programs, and more specifically, to the development and/or analysis of one or more quantum computing programs.

Quantum computing programs (e.g., commonly referred to as "circuits") can be developed in a circuit creation environment generated by a computer program. The circuit creation environment can enable a user to create and/or modify circuit configurations to achieve one or more desired outcomes. However, conventional circuit creation environments provide limited means for analysis of developing quantum computing programs. For example, conventional developing quantum computing programs do not enable a user to preview changes made to the subject circuit over time, nor how the changes affect the operational characteristics of the circuit.

In addition, conventional developing quantum computing programs do not readily provide a user with a method to preview changes made to a subject quantum circuit over time or preview how the changes affect the quantum circuit. For example, conventional circuit creation environments fail to control multiple visualization of the quantum circuit and fail to selectively view modifications over the quantum circuit's entire course of development (e.g., rather than at a single point in development). Thus, conventional circuit creation environments provide static analysis of a subject quantum circuit without enabling a review of past modifications made through the development process and/or how past modifications have affected the subject quantum circuit through the development process.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments described herein, systems, computer-implemented methods, apparatuses and/or computer program products that can facilitate development and/or analysis of one or more quantum computing programs are described.

According to an embodiment, a system is provided. The system can comprise a memory that can store computer executable components. The system can also comprise a processor, operably coupled to the memory, and that can execute the computer executable components stored in the memory. The computer executable components can comprise a circuit component, operatively coupled to the processor, that can create a quantum computing program over a period of time. The computer executable components can also comprise a visualization component, operatively coupled to the processor, that can generate a quantum state visualization that can depict a characterization of the quantum computing program over the period of time. An advantage of such a system can be that the quantum state visualization can depict how the quantum computing program has changed over the period of time.

In some examples, the circuit component can create the quantum computing program based on a modification to a circuit template. Additionally, the visualization component can update the quantum state visualization based on the modification. The quantum state visualization can depict the characterization at: a first time prior to the modification within the period of time, a second time of the modification within the period of time, and a third time subsequent to the modification within the period of time. An advantage of such a system can be that the quantum state visualization can depict how one or more modifications affect the subject quantum computing program.

According to an embodiment, a system is provided. The system can comprise a memory that can store computer executable components. The system can also comprise a processor, operably coupled to the memory, and that can execute the computer executable components stored in the memory. The computer executable components can comprise a circuit component, operatively coupled to the processor, that can generate a circuit creation environment to facilitate development of a quantum computing program. The computer executable components can also comprise a results component, operatively coupled to the processor, that can generate a display depicting a data set characterizing an operation of the quantum computing program based on a circuit modification generated in the circuit creation environment. An advantage of such a system can be the depiction of current quantum computing program results in-line with a circuit diagram of the respective quantum computing program.

In some examples, the display can further depict a second data set characterizing another operation of a modified version of the quantum computing program. An advantage of such a system can be the facilitate of a comparative analysis between multiple versions of a quantum computing program.

According to an embodiment, a computer-implemented method is provided. The computer-implemented method can comprise developing, by a system operatively coupled to a processor, a quantum computing program. The computer-implemented method can also comprise implementing, by the system, the quantum computing program on a plurality of backend devices that can run the quantum computing program and return operational data to the system. An advantage of such a computer-implemented method can be the operation of a quantum computing program on multiple distinctive backend devices.

In some examples, the computer-implemented method can also comprise modifying, by the system, the quantum computing program in accordance with an operation restriction of a quantum device to create a modified quantum computing program. Additionally, the computer-implemented method can comprise implementing, by the system, the modified quantum computing program on a backend device from the plurality of backend devices. The backend device can be the quantum device. An advantage of such a computer-implemented method can be that a quantum computing program can be developed in an ideal environment and implemented on a quantum device with operation restrictions.

According to an embodiment, a computer-implemented method is provided. The computer-implemented method can comprise implementing, by a system operatively coupled to a processor, a quantum computing program on a backend device that can return operational data regarding the quantum computing program to the system. The computer-implemented method can also comprise storing, by the system, the operational data regarding the quantum computing program in a database archive. An advantage of such a computer-implemented method can be the creation and/or maintenance of historical record regarding a subject quantum computing program.

In some examples, wherein the database archive can comprise additional operational data regarding a second quantum computing program. An advantage of such a computer-implemented method can be the facilitation of a comparative analysis between previous versions of a quantum computing program stored in an archive.

According to an embodiment, a computer program product for facilitating a construction of a quantum computing program is provided. The computer program product can comprise a computer readable storage medium having program instructions embodied therewith. The program instructions executable by a processor to cause the processor to develop, by a system operatively coupled to the processor, the quantum computing program based on a modification to a circuit template over a period of time. The program instructions can also cause the processor to generate, by the system, a quantum state visualization that depicts a characterization of the quantum computing program over the period of time. An advantage of such a computer program product can be an analysis of the quantum computing program over a course of development can be made quickly and/or efficiently through the use of one or more visualizations.

In some examples, the program instructions can further cause the processor to implement, by the system, the quantum computing program on a plurality of backend devices that can run the quantum computing program and return operational data to the system. An advantage of such a computer program product can be that the quantum state visualizations can facilitate designing a quantum computing program that can be implemented on a variety of backend devices.

BRIEF DESCRIPTION OF THE DRAWINGS

FIG. 10 illustrates a diagram of an example, non-limiting circuit creation environment that can be generated by one or more systems and can depict a preview of one or more automated modifications made to a subject quantum computing program in accordance with one or more embodiments described herein.

FIG. 14 illustrates a flow diagram of an example, non-limiting method that can facilitate development and/or analysis of one or more quantum computing programs in accordance with one or more embodiments described herein.

FIG. 15 illustrates a flow diagram of an example, non-limiting method that can facilitate development and/or analysis of one or more quantum computing programs in accordance with one or more embodiments described herein.

FIG. 16 illustrates a flow diagram of an example, non-limiting method that can facilitate development and/or analysis of one or more quantum computing programs in accordance with one or more embodiments described herein.

FIG. 17 illustrates a flow diagram of an example, non-limiting method that can facilitate development and/or analysis of one or more quantum computing programs in accordance with one or more embodiments described herein.

DETAILED DESCRIPTION

Figure 1:
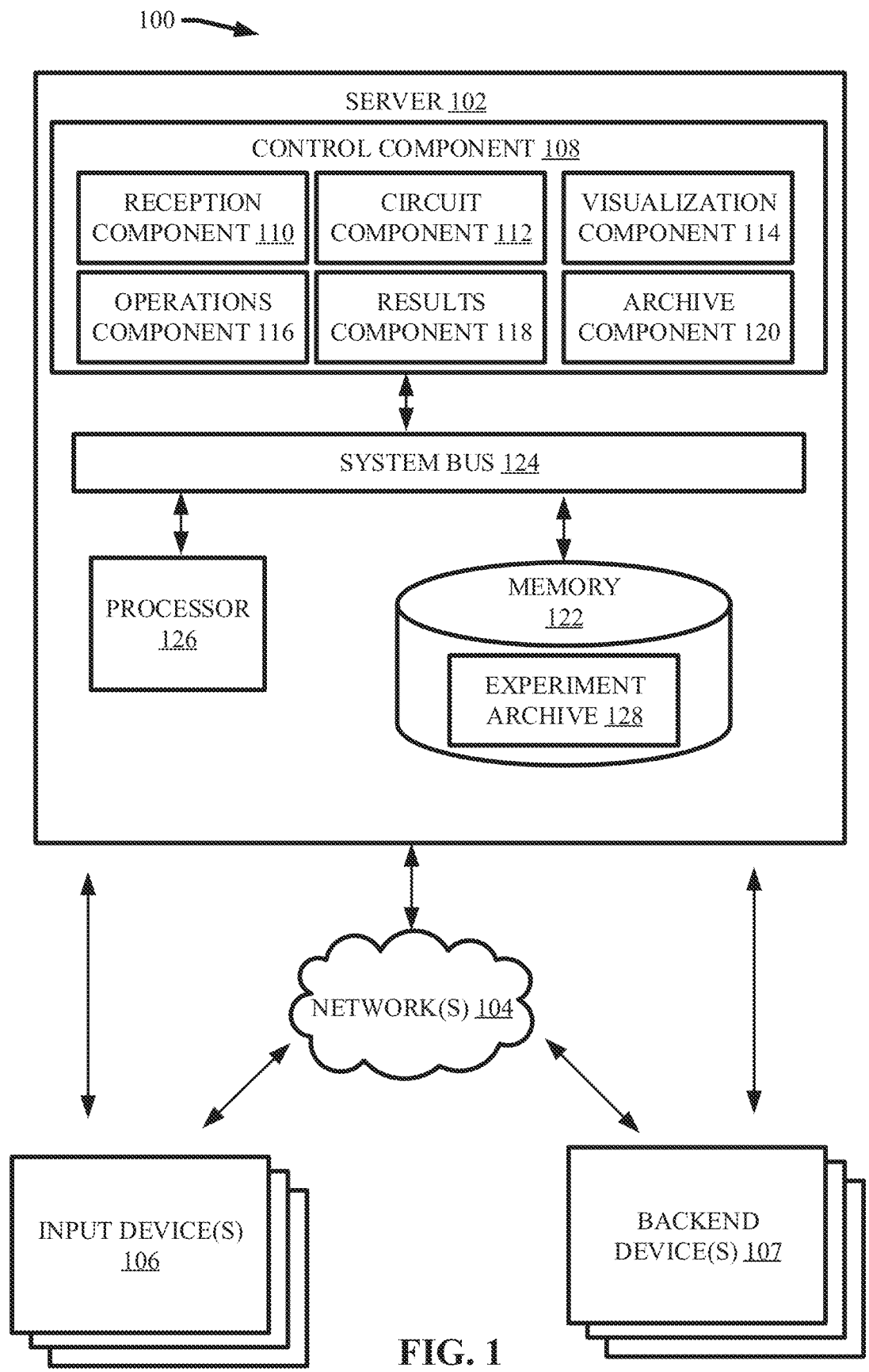
FIG. 1 illustrates a block diagram of an example, non-limiting system that can facilitate development and/or analysis of one or more quantum computing programs in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Given the above problems with conventional techniques for developing quantum computing programs; the present disclosure can be implemented to produce a solution to one or more of these problems in the form of a centralized circuit creation environment that can allow user to: develop quantum computing programs, preview and/or debug quantum computing programs with visualizations, compile and/or run quantum computing programs on multiple backend devices; view current operational characteristics of a quantum computing program as the circuit is being developed, and/or store previous versions and/or results of a quantum computing program to an archive. Advantageously, the centralized circuit creation environment can generate one or more visualizations to characterize how one or more features of a quantum computing program can change over time (e.g., can change over the course of development of the quantum computing program). Further, the one or more systems, computer-implemented methods, and/or computer program products described herein can enable a quantum computing program developer to: implement a quantum computing program on various backend devices, analyze the development history of a quantum computing program to analyze the effect of one or more modifications, and/or compare and contrast various versions of a subject quantum computing program.

Various embodiments of the present invention can be directed to computer processing systems, computer-implemented methods, apparatus and/or computer program products that facilitate the development and/or analysis of one or more quantum computing programs. For example, one or more embodiments can regard a circuit creation environment that can enable users to add quantum gates and/or write assembly code to develop one or more quantum computing programs. Also, the circuit creation environment created by various embodiments described herein can comprise one or more quantum state visualizations that can update in real time as a subject quantum computer program is being developed. For instance, the circuit creation environment can enable a user to rewind and/or preview the state of the quantum state visualizations based on modification made to the subject quantum computing program during development. Additionally, the circuit creation environment can selectively implement one or more operating restrictions and/or guidelines to facilitate users in designing circuits for a particular quantum device. Further, one or more embodiments can enable users to debug selected qubits in a subject quantum computing program based on one or more quantum state visualizations. Moreover, the various embodiments can regard a circuit creation environment that can compile and/or run the same quantum computing program on multiple backend devices and/or present changes made to the quantum computing program when the circuit is run on different quantum devices. In addition, one or more embodiments described herein can generate one or more results displays that can depict, for each run of a quantum computing program, at least: data from different backend devices, generated quantum state visualizations, execution statistics, and/or device error rates. Also, the one or more embodiments can regard the creation of a results archive that can: store data regarding past versions of a subject quantum computing program, enable users to readily practice version control with regard to their quantum circuits, and/or maintain a record of experimental history regarding one or more quantum computing programs.

The computer processing systems, computer-implemented methods, apparatus and/or computer program products employ hardware and/or software to solve problems that are highly technical in nature (e.g., development and/or analysis of one or more quantum computing programs), that are not abstract and cannot be performed as a set of mental acts by a human. For example, various embodiments described herein regard the construction of one or more quantum computing programs and/or the collection of operational data that FIG. 1 illustrates a block diagram of an example, non-limiting system 100 that can facilitate development and/or analysis of one or more quantum computing programs. Repetitive description of like elements employed in other embodiments described herein is omitted for sake of brevity. Aspects of systems (e.g., system 100 and the like), apparatuses or processes in various embodiments of the present invention can constitute one or more machine-executable components embodied within one or more machines, e.g., embodied in one or more computer readable mediums (or media) associated with one or more machines. Such components, when executed by the one or more machines, e.g., computers, computing devices, virtual machines, etc. can cause the machines to perform the operations described.

As shown in FIG. 1, the system 100 can comprise one or more servers 102, one or more networks 104, one or more input devices 106, and/or one or more backend devices 107. The server 102 can comprise control component 108, circuit component 112, visualization component 114, operations component 116, results component 118, and/or archive component 120. Also, the server 102 can comprise or otherwise be associated with at least one memory 122. The server 102 can further comprise a system bus 124 that can couple to various components such as, but not limited to, the control component 108 and associated components, memory 122 and/or a processor 126. While a server 102 is illustrated in FIG. 1, in other embodiments, multiple devices of various types can be associated with or comprise the features shown in FIG. 1. Further, the server 102 can communicate with a cloud computing environment directly and/or via the one or more networks 104.

The one or more networks 104 can comprise wired and wireless networks, including, but not limited to, a cellular network, a wide area network (WAN) (e.g., the Internet) or a local area network (LAN). For example, the server 102 can communicate with the server 102 and/or the one or more backend devices 107 (and vice versa) using virtually any desired wired or wireless technology including for example, but not limited to: cellular, WAN, wireless fidelity (Wi-Fi), Wi-Max, WLAN, Bluetooth technology, a combination thereof, and/or the like. Further, although in the embodiment shown the control component 108 can be provided on the one or more servers 102, it should be appreciated that the architecture of system 100 is not so limited. For example, the control component 108, or one or more components of control component 108, can be located at another computer device, such as another server device, a client device, etc.

The one or more input devices 106 can comprise one or more computerized devices, which can include, but are not limited to: personal computers, desktop computers, laptop computers, cellular telephones (e.g., smart phones), computerized tablets (e.g., comprising a processor), smart watches, keyboards, touch screens, mice, a combination thereof, and/or the like. A user of the system 100 can utilize the one or more input devices 106 to input data into the system 100, thereby sharing (e.g., via a direct connection and/or via the one or more networks 104) said data with the server 102. For example, the one or more input devices 106 can send data to the reception component 110 (e.g., via a direct connection and/or via the one or more networks 104). Additionally, the one or more input devices 106 can comprise one or more displays that can present one or more outputs generated by the system 100 to a user. For example, the one or more displays can include, but are not limited to: cathode tube display ("CRT"), light-emitting diode display ("LED"), electroluminescent display ("ELD"), plasma display panel ("PDP"), liquid crystal display ("LCD"), organic light-emitting diode display ("OLED"), a combination thereof, and/or the like.

A user of the system 100 can utilize the one or more input devices 106 and/or the one or more networks 104 to input one or more settings and/or commands into the system 100. For example, in the various embodiments described herein, a user of the system 100 can operate and/or manipulate the server 102 and/or associate components via the one or more input devices 106. Additionally, a user of the system 100 can utilize the one or more input devices 106 to display one or more outputs (e.g., displays, data, visualizations, and/or the like) generated by the server 102 and/or associate components.

The one or more backend devices 107 can run quantum computing programs (e.g., generated by the control component 108) and return results regard the subject quantum computing programs. Example backend devices 107 can comprise quantum simulators and/or quantum devices (e.g., quantum computers). The one or more backend devices 107 can return results such as operational data regarding a subject quantum computing program and/or one or more outputs generated by the subject quantum computing program. The one or more backend devices 107 can return the results to the server 102 (e.g., the control component 108) via a direct electrical connection and/or one or more networks 104.

The reception component 110 can receive the data entered by a user of the system 100 via the one or more input devices 106 and/or the results achieved by the one or more backend devices 107. The reception component 110 can be operatively coupled to the one or more input devices 106 and/or backend devices 107 directly (e.g., via an electrical connection) or indirectly (e.g., via the one or more networks 104). Additionally, the reception component 110 can be operatively coupled to one or more components of the server 102 (e.g., one or more component associated with the control component 108, system bus 124, processor 126, and/or memory 122) directly (e.g., via an electrical connection) or indirectly (e.g., via the one or more networks 104). In one or more embodiments, the one or more settings, commands, and/or results received by the reception component 110 can be communicated to the associate components of the control component 108 (e.g., directly or indirectly) and/or can be stored in the memory 122 (e.g., located on the server 102 and/or within a cloud computing environment).

The circuit component 112 can generate a circuit creation environment, which can be presented to a user of the system 100 via the one or more input devices 106 and/or can facilitate development of one or more quantum computing programs. The circuit component 112 can receive one or more commands from a user of the system 100 that can direct a configuration of a subject quantum computing program within the circuit creation environment. For example, the circuit component 112 can facilitate development of a quantum computing program by enabling a user to direct the placement, relocation, addition, and/or subtraction of various parameters of a quantum circuit. For instance, the circuit component 112 can generate a circuit creation environment in which a user can manipulate the configuration of various quantum gates (e.g., qubit gates, unitary gates, a combination thereof, and/or the like), barriers, operations, and/or subroutines within a subject quantum circuit.

Figure 2:
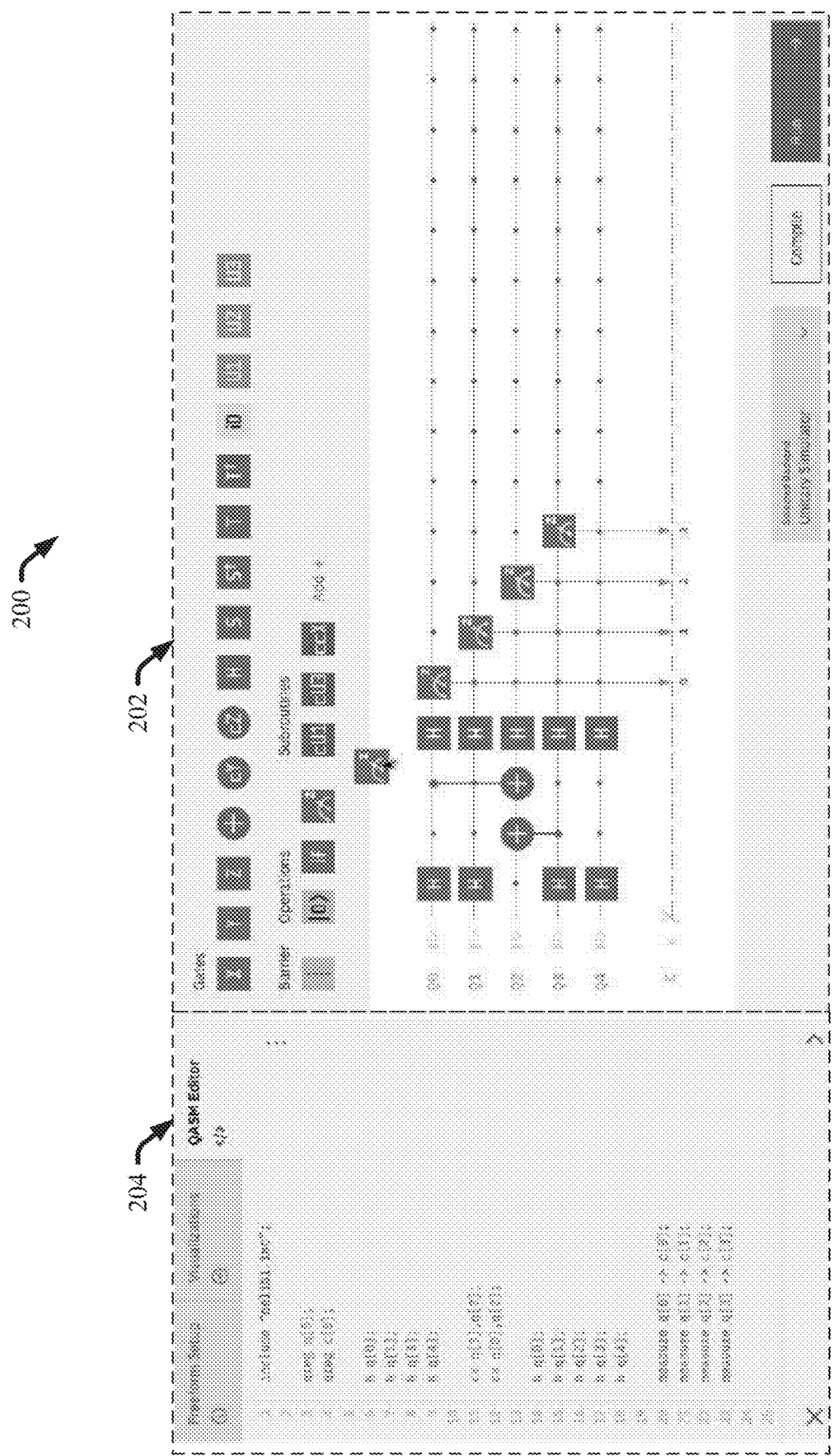
FIG. 2 illustrates a diagram of an example, non-limiting circuit creation environment that can be generated by one or more systems to facilitate development and/or analysis of one or more quantum computing programs in accordance with one or more embodiments described herein.

FIG. 2 illustrates a diagram of a non-limiting exemplary circuit creation environment 200 that can be generated by the circuit component 112 and/or can facilitate development and/or analysis of one or more quantum computing programs in accordance with one or more embodiments described herein. Repetitive description of like elements employed in other embodiments described herein is omitted for sake of brevity. As shown in FIG. 2, the exemplary circuit creation environment 200 can be described with regards to a first panel 202 and/or a second panel 204, which can be delineated in FIG. 2 with dashed lines.

The first panel 202 can comprise a section of the exemplary circuit creation environment 200 in which a layout of the subject quantum computing program can be depicted. As shown in FIG. 2, the first panel 202 can comprise icons of a plurality of circuit parameters (e.g., quantum gates, barriers, operations, and/or subroutines) that can be manipulated by a user of the system 100 to develop a quantum computing program. For example, a user of the system 100 can modify a circuit template and/or subject quantum circuit to facilitate development of a quantum computing program. In one or more embodiments, the circuit component 112 can generate the exemplary circuit creation environment 200, which can enable a user to drag-and-drop one or more circuit parameters into a circuit template and/or subject quantum circuit to execute one or more desired modification and/or thereby develop a subject quantum computing program.

The second panel 204 can comprise a section of the exemplary circuit creation environment 200 in which a user can enter data and/or view one or more visualizations regarding the subject quantum computing program. For example, the circuit component 112 can generate the exemplary circuit creation environment 200, which can enable a user to write assembly code to direct one or more modifications to a circuit template and/or subject quantum circuit. For instance, assembly code entered into the first panel 202 can direct the circuit component 112 to add, subtract, relocate, and/or reposition one or more circuit parameters (e.g., quantum gates, barriers, operations, and/or subroutines).

As shown in FIG. 2, in one or more embodiments the circuit component 112 can create a hybrid circuit creation environment (e.g., exemplary circuit creation environment 200) that can facilitate the development of one or more quantum computing programs by one or more modifications to a circuit template and/or subject quantum circuit, wherein the modifications can be executed by the circuit component 112 via a drag-and-drop interface (e.g., first panel 202) and/or a code editor interface (e.g., second panel 204). Additionally, in various embodiments the circuit component 112 can generate a circuit creation environment that can facilitate development of a quantum computing program in an ideal environment. As used herein, the term "ideal environment" can refer to a circuit creation environment free from one or more quantum circuit configuration constraints that can be necessitated by operation restraints of a particular backend device 107.

Figure 3:
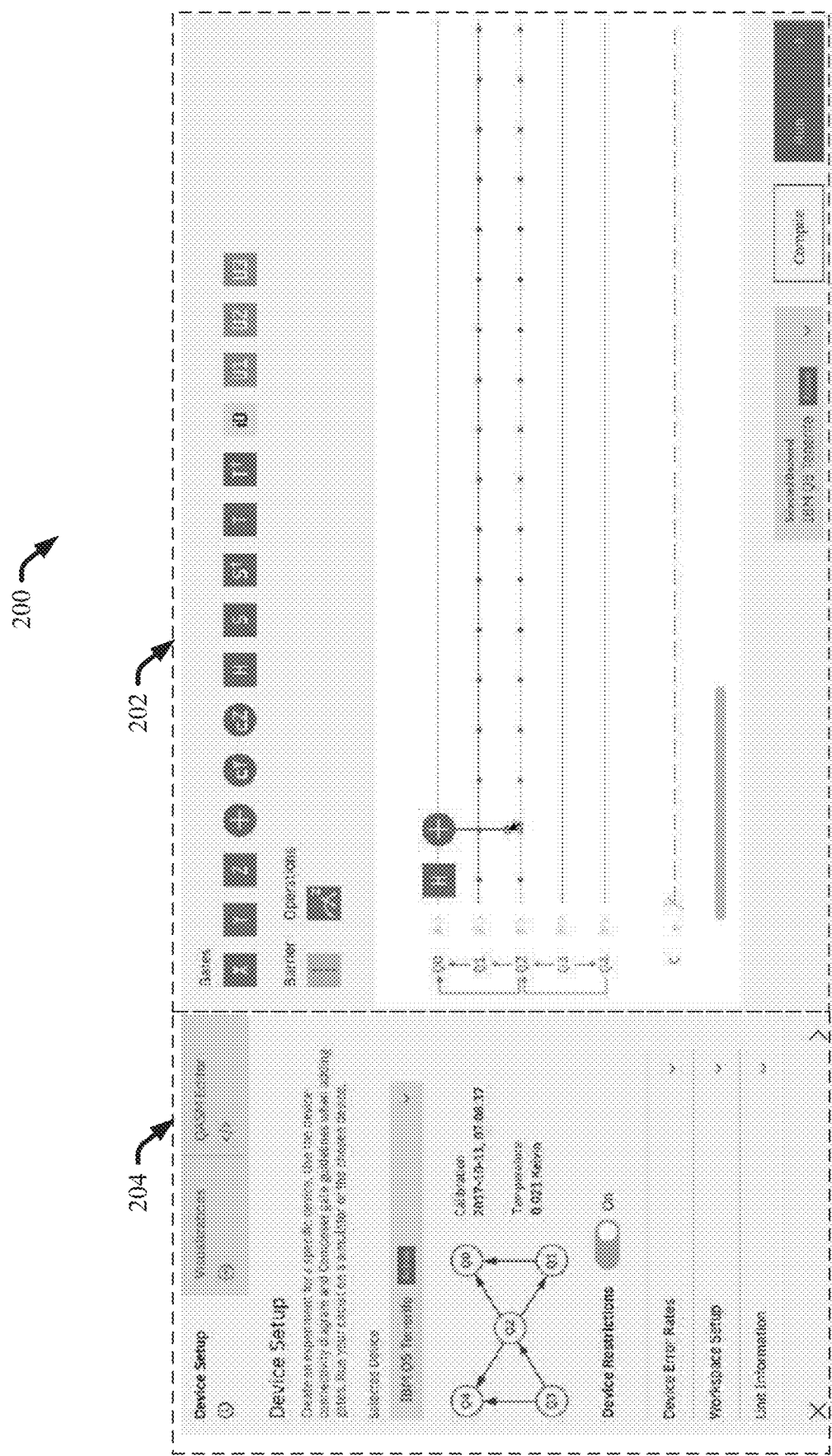
FIG. 3 illustrates a diagram of an example, non-limiting circuit creation environment that can be generated by one or more systems to facilitate development and/or analysis of one or more quantum computing programs in accordance with one or more embodiments described herein.

FIG. 3 illustrates another diagram of the non-limiting exemplary circuit creation environment 200 that can be generated by the circuit component 112 and/or can facilitate development and/or analysis of one or more quantum computing programs in accordance with one or more embodiments described herein. Repetitive description of like elements employed in other embodiments described herein is omitted for sake of brevity. As shown in FIG. 3, in one or more embodiments, the circuit component 112 can generate a circuit creation environment that can facilitate development of a quantum computing program in a constrained environment. As used herein, the term "constrained environment" can refer to a circuit creation environment comprising one or more quantum circuit configuration constraints implemented in accordance with operation restrictions of a particular backend device 107. For example, the one or more quantum circuit configuration constraints can be one or more design restrictions that can be met to facilitate proper function of the quantum computing program on a desired backend device 107. Example, operation restrictions of a particular backend device 107 can regard, for example: restricting the user on the use of entanglement between qubits that are not connected in the configuration of the quantum device, the use of multi-qubit gates (e.g., qubit connections in hardware of the subject backend device 107 can dictate how entangled multi-qubit gates and/or subroutines can be applied, limiting a number of sequential quantum gates a user can add to the subject quantum circuit (e.g., based on a coherence time of the subject backend device 107), a combination thereof, and/or the like.

For instance, FIG. 3 depicts an embodiment of the exemplary circuit creation environment 200 that can enable a user of the system 100 to define one or more quantum circuit configuration constraints to facilitate development of a quantum computing program for a particular backend device 107. Thus, in various embodiments the circuit component 112 can facilitate development of a quantum computing program: via a drag-and-drop interface, via a code editor interface, in an ideal environment, in a constrained environment, and/or a combination thereof.

Referring again to FIG. 1, the visualization component 114 can generate one or more quantum state visualizations that can characterize a quantum computing program over a period of time. During the course of development, a quantum computing program can be subject to one or more modifications (e.g., implemented and/or facilitated by the circuit component 112). With each modification, one or more characteristics of the quantum computing program can be altered. The visualization component 114 can generate one or more quantum state visualizations to depict the one or more characteristics of the quantum computing program at various points in time during the development process. For example, the visualization component 114 can generate one or more quantum state visualizations in response to a modification to the subject quantum computing program being developed (e.g., in response to a modification to a circuit template and/or a subject quantum circuit). Additionally, and/or alternatively, the visualization component 114 can generate the one or more quantum state visualizations at defined time intervals throughout development of the quantum computing program. Further, the visualization component 114 can generate the one or more quantum state visualizations at defined stages of development of the quantum computing program.

Example characteristics that can be depicted by the one or more quantum state visualizations can include, but are not limited to: entanglement, decoherence, errors, the location of data in a quantum state, a combination thereof, and/or the like. In various embodiments, the visualization component 114 can generate various types of quantum visualizations. Example types of quantum state visualizations can include, but are not limited to: one or more Bloch spheres, one or more matrix representations, one or more quantum spheres, one or more Hinton plots, one or more cityscape diagrams, one or more Pauli vector diagrams, a combination thereof, and/or the like.

In one or more embodiments, the visualization component 114 can present the one or more quantum state visualizations to a user of the system 100 in real-time. Additionally, the visualization component 114 can present one or more quantum state visualizations at previous past moments. For example, the visualization component 114 can generate and/or automatically update one or more quantum state visualizations in response to a defined parameter (e.g., in response to a modification to the quantum computing program, a time interval, and/or a developmental stage) while storing previous versions of the quantum state visualizations (e.g., in the memory 122). Thus, the visualization component 114 can present quantum state visualizations based on current configurations of the quantum computing program and/or quantum state visualizations based on past configurations of the quantum computing program. For example, the visualization component 114 can compile current and past quantum state visualizations into an animation (e.g., a slide show). By presenting current and/or past quantum state visualizations of a quantum computing program, the visualization component 114 can depict how one or more characteristics of the quantum circuit have changed throughout a development and/or creation process.

Figure 4:
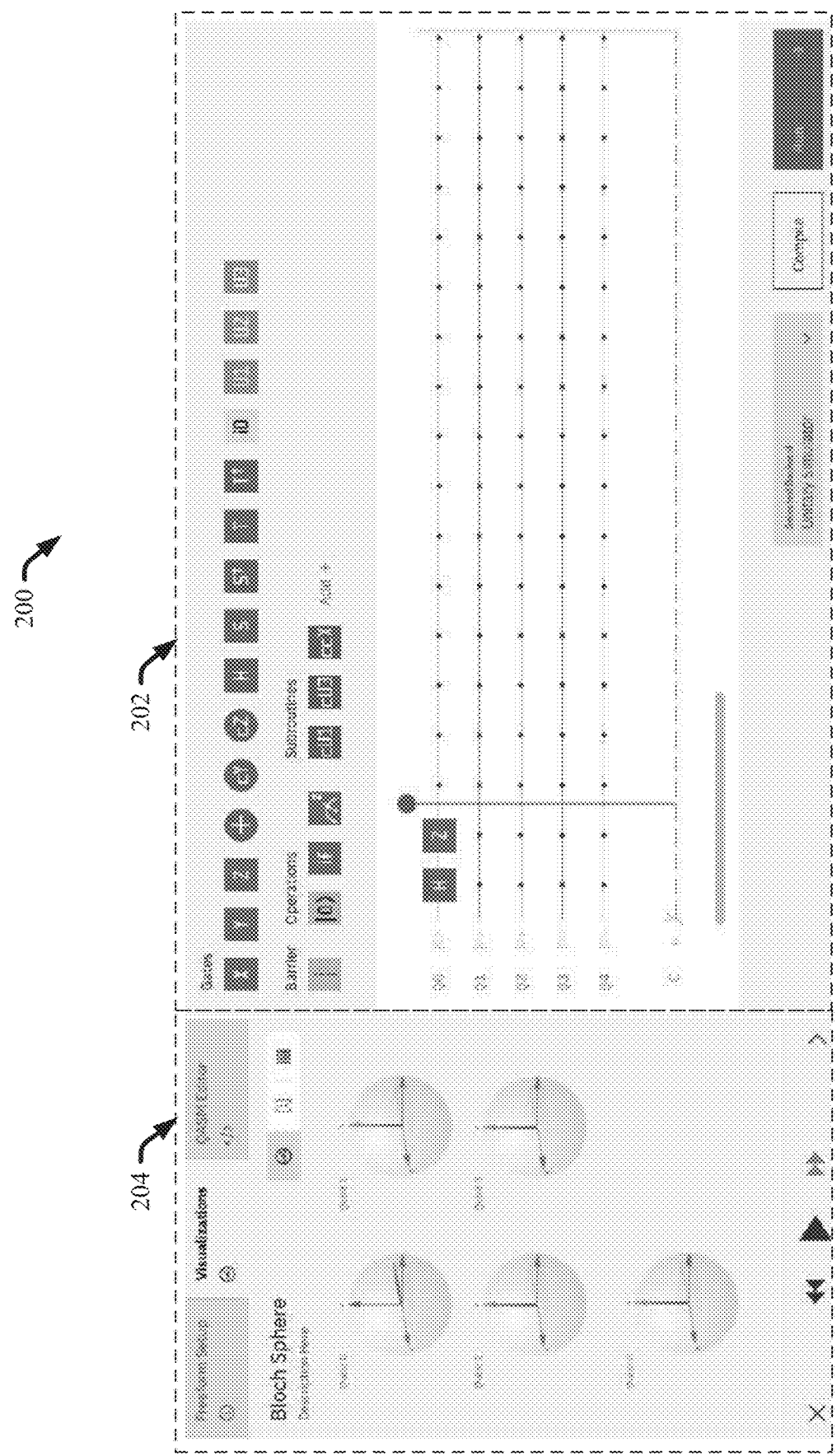
FIG. 4 illustrates a diagram of an example, non-limiting circuit creation environment that can be generated by one or more systems and can comprise one or more quantum state visualizations to facilitate development and/or analysis of one or more quantum computing programs in accordance with one or more embodiments described herein.

FIG. 4 illustrates a diagram of the non-limiting exemplary circuit creation environment 200 further comprising one or more quantum state visualizations that can be generated by the visualization component 114 in accordance with one or more embodiments described herein. Repetitive description of like elements employed in other embodiments described herein is omitted for sake of brevity. As shown in FIG. 4, the one or more quantum state visualizations generated by the visualization component 114 can be included in the circuit creation environment (e.g., exemplary circuit creation environment 200) generated by the circuit component 112. For example, the one or more quantum state visualizations can be depicted within the second panel 204 of the exemplary circuit creation environment 200.

In one or more embodiments, a user of the system 100 can have the option to view (e.g., via the circuit creation environment) one or more quantum state visualizations of a plurality of quantum state visualizations generated by the visualization component 114. For example, the user can select a desired type of quantum state visualization. The one or more quantum state visualizations can be depicted to the user (e.g., via the circuit creation environment) in real-time as the user develops the subject quantum computing program characterized by the one or more quantum state visualizations. In response to a defined parameter (e.g., in response to a modification to the quantum computing program, a time interval, and/or a developmental stage) the visualization component 114 can update the one or more quantum state visualizations to reflect the parameter's affect on the developing quantum circuit. For example, as a modification to the quantum computing program is implemented (e.g., a quantum gate is added) the visualization component 114 can update the one or more quantum state visualizations in real time to reflect the modification's affect on the quantum computing program.

Further, one or more indicators (e.g., generated by the visualization component 114 and/or the circuit component 112) can be overlaid onto the depiction of the subject quantum computing program to indicate at which point in the development process the displayed quantum state visualization is characterizing. For example, the one or more indicators can be presented in the first panel 202. For instance, FIG. 4 shows a solid vertical line in the first panel 202 to exemplify an indicator regarding the one or more quantum state visualizations depicted in the second panel 204. In various embodiments, a user of the system 100 can move (e.g., with a mouse) the one or more indicators to alter the one or more quantum state visualizations to characterize different points along the development process (e.g., different points throughout the quantum circuit). Additionally, a user can use play, pause, rewind, and/or fast forward controls to view an animation (e.g., generated by the visualization component 114) of how the quantum state visualization changes over a period time (e.g., over a development of the subject quantum computing program).

The visualization component 114 can generate multiple types of quantum state visualizations to characterize the same quantum computing program. Further, a user of the system 100 can select (e.g., via the one or more input devices 106) a desired type of quantum state visualization to be depicted (e.g., within a circuit creation environment created by the circuit component 112). Further, a user can control (e.g., via the one or more input devices 106) the circuit creation environment (e.g., the second panel 204 of the exemplary circuit creation environment 200) to change the type of quantum state visualization depicted.

Figure 5A:
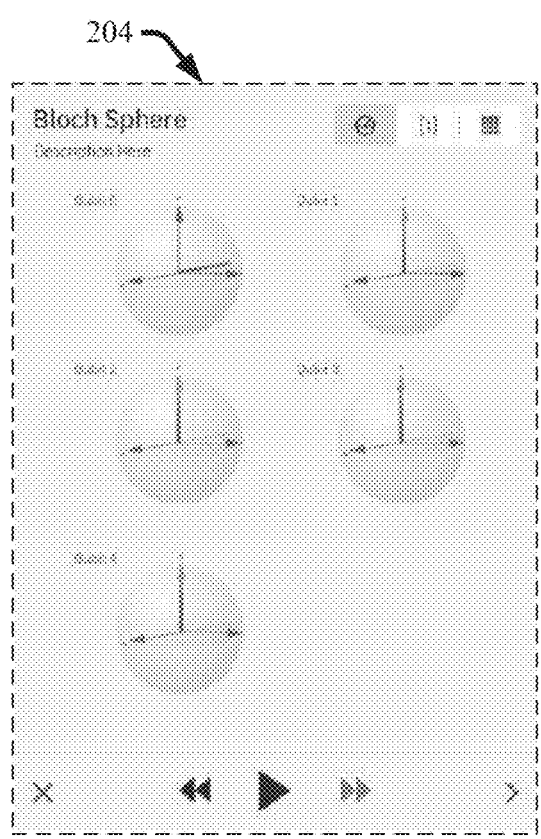
FIG. 5A illustrates a diagram of an example, non-limiting quantum state visualization that can be depicted in one or more circuit creation environments, which can be generated by one or more systems to facilitate development and/or analysis of one or more quantum computing programs in accordance with one or more embodiments described herein.

FIG. 5A illustrates a diagram of an exemplary, non-limiting first quantum state visualization that can be generated by the visualization component 114 in accordance with one or more embodiments described herein. Repetitive description of like elements employed in other embodiments described herein is omitted for sake of brevity. The first quantum state visualization can be comprised with the circuit creation environment generated by the circuit component 112. For example, the first quantum state visualization can be comprised within the second panel 204 of the exemplary circuit creation environment 200. In one or more embodiments, the first quantum state visualization can be one or more Bloch spheres.

Figure 5B:
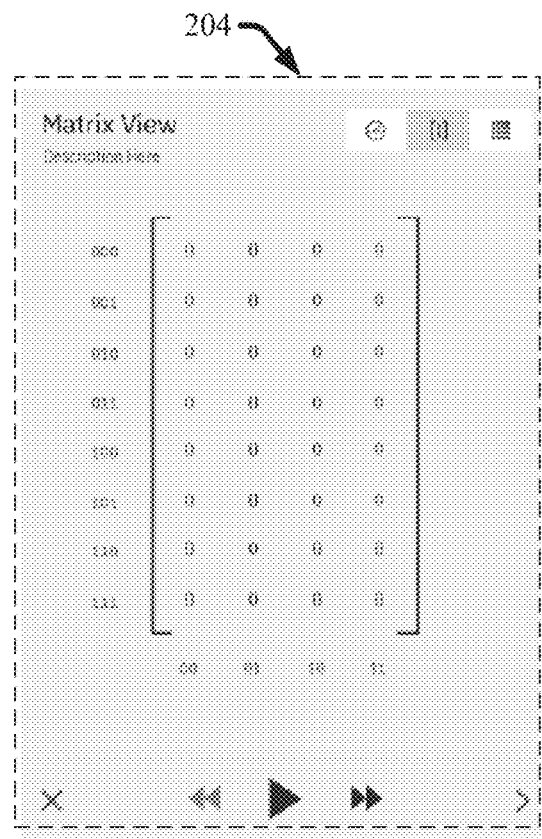
FIG. 5B illustrates a diagram of an example, non-limiting quantum state visualization that can be depicted in one or more circuit creation environments, which can be generated by one or more systems to facilitate development and/or analysis of one or more quantum computing programs in accordance with one or more embodiments described herein.

FIG. 5B illustrates a diagram of an exemplary, non-limiting second quantum state visualization that can be generated by the visualization component 114 in accordance with one or more embodiments described herein. Repetitive description of like elements employed in other embodiments described herein is omitted for sake of brevity. The second quantum state visualization can be comprised with the circuit creation environment generated by the circuit component 112. For example, the first quantum state visualization can be comprised within the second panel 204 of the exemplary circuit creation environment 200. In one or more embodiments, the second quantum state visualization can be one or more matrix representations.

Figure 5C:
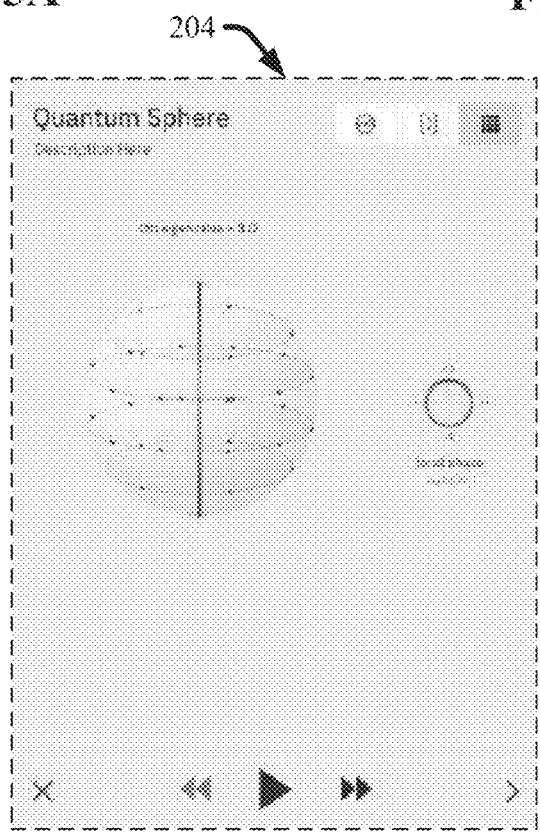
FIG. 5C illustrates a diagram of an example, non-limiting quantum state visualization that can be depicted in one or more circuit creation environments, which can be generated by one or more systems to facilitate development and/or analysis of one or more quantum computing programs in accordance with one or more embodiments described herein.

FIG. 5C illustrates a diagram of an exemplary, non-limiting third quantum state visualization that can be generated by the visualization component 114 in accordance with one or more embodiments described herein. Repetitive description of like elements employed in other embodiments described herein is omitted for sake of brevity. The third quantum state visualization can be comprised with the circuit creation environment generated by the circuit component 112. For example, the third quantum state visualization can be comprised within the second panel 204 of the exemplary circuit creation environment 200. In one or more embodiments, the third quantum state visualization can be one or more quantum spheres.

Figure 6A:
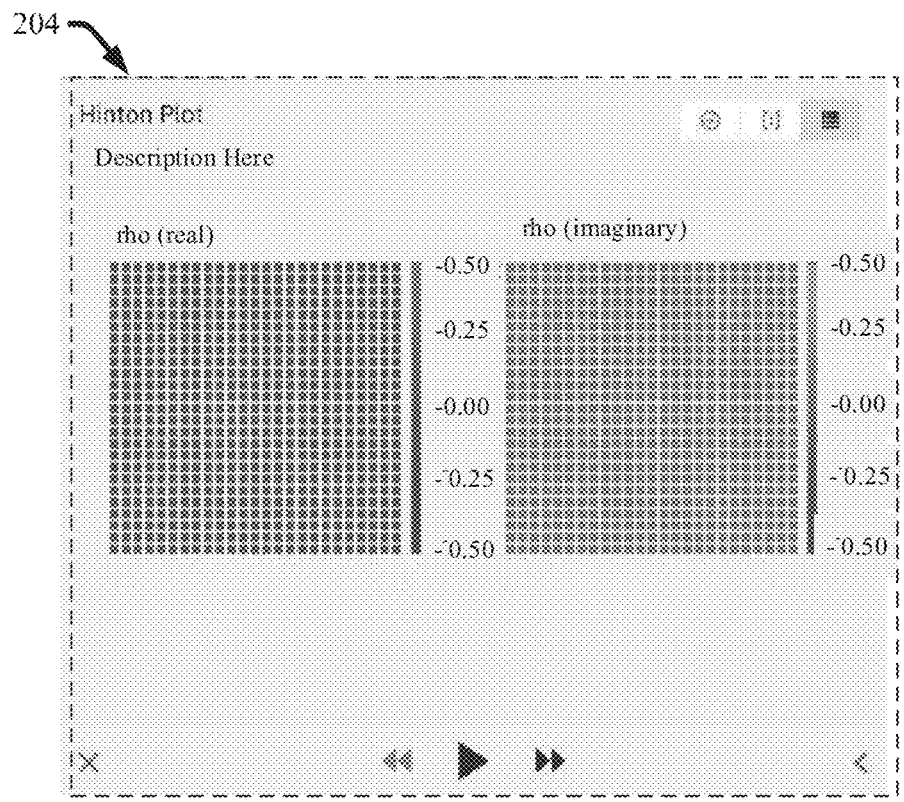
FIG. 6A illustrates a diagram of an example, non-limiting quantum state visualization that can be depicted in one or more circuit creation environments, which can be generated by one or more systems to facilitate development and/or analysis of one or more quantum computing programs in accordance with one or more embodiments described herein.

FIG. 6A illustrates a diagram of an exemplary, non-limiting fourth quantum state visualization that can be generated by the visualization component 114 in accordance with one or more embodiments described herein. Repetitive description of like elements employed in other embodiments described herein is omitted for sake of brevity. The fourth quantum state visualization can be comprised with the circuit creation environment generated by the circuit component 112. For example, the fourth quantum state visualization can be comprised within the second panel 204 of the exemplary circuit creation environment 200. In one or more embodiments, the fourth quantum state visualization can be one or more Hinton plots.

Figure 6B:
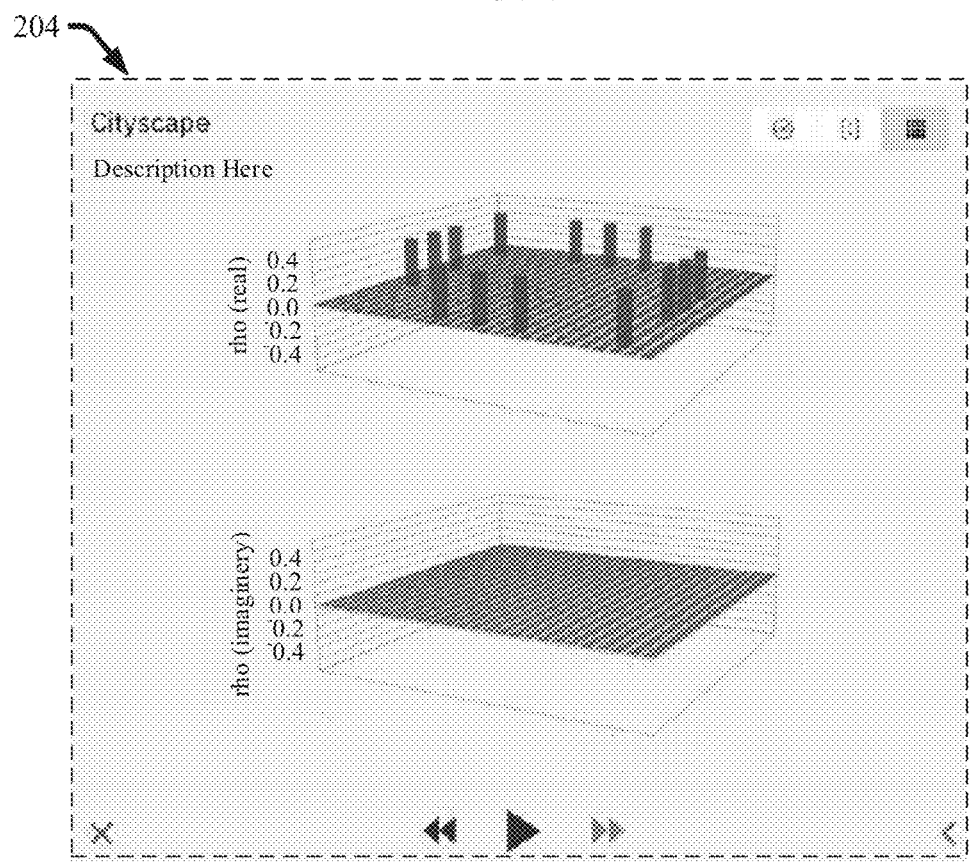
FIG. 6B illustrates a diagram of an example, non-limiting quantum state visualization that can be depicted in one or more circuit creation environments, which can be generated by one or more systems to facilitate development and/or analysis of one or more quantum computing programs in accordance with one or more embodiments described herein.

FIG. 6B illustrates a diagram of an exemplary, non-limiting fifth quantum state visualization that can be generated by the visualization component 114 in accordance with one or more embodiments described herein. Repetitive description of like elements employed in other embodiments described herein is omitted for sake of brevity. The fifth quantum state visualization can be comprised with the circuit creation environment generated by the circuit component 112. For example, the fifth quantum state visualization can be comprised within the second panel 204 of the exemplary circuit creation environment 200. In one or more embodiments, the fifth quantum state visualization can be one or more cityscape diagrams.

Figure 7:
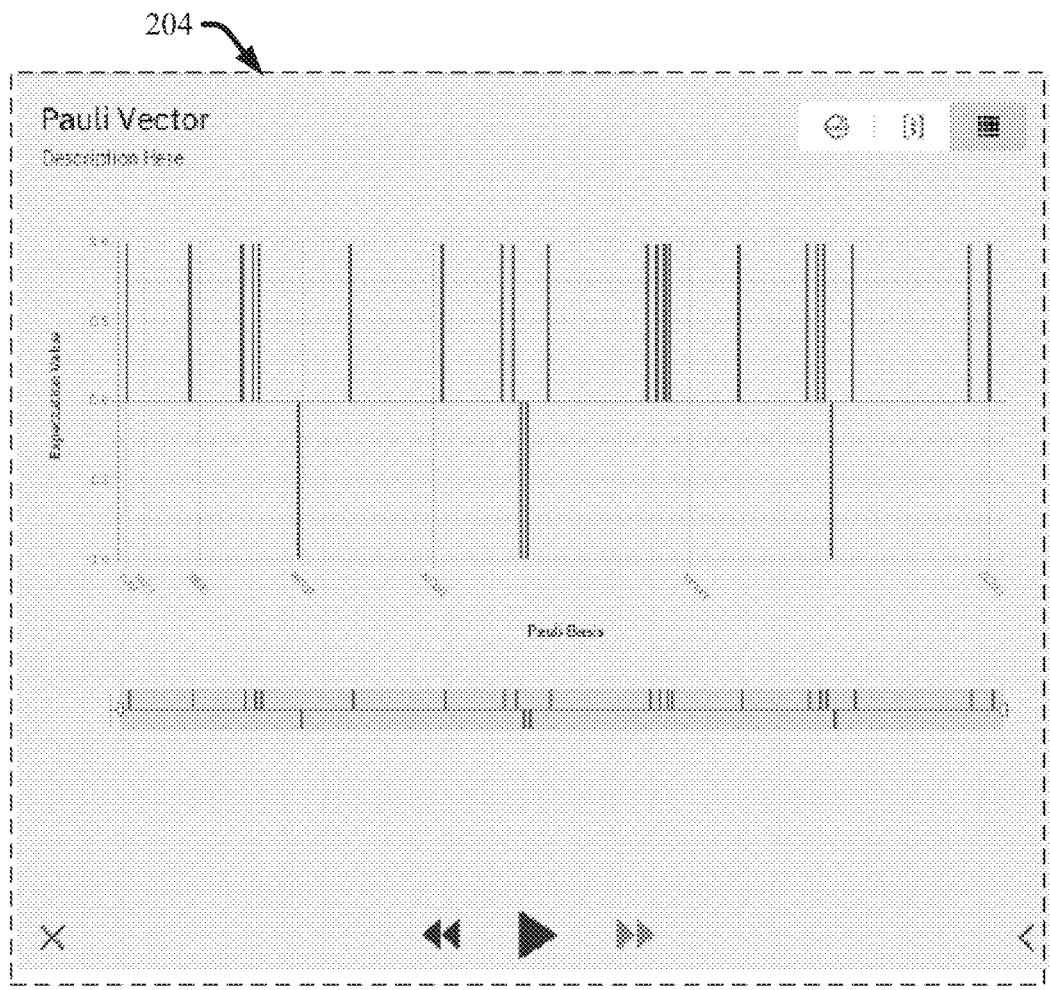
FIG. 7 illustrates a diagram of an example, non-limiting quantum state visualization that can be depicted in one or more circuit creation environments, which can be generated by one or more systems to facilitate development and/or analysis of one or more quantum computing programs in accordance with one or more embodiments described herein.

FIG. 7 illustrates a diagram of an exemplary, non-limiting sixth quantum state visualization that can be generated by the visualization component 114 in accordance with one or more embodiments described herein. Repetitive description of like elements employed in other embodiments described herein is omitted for sake of brevity. The sixth quantum state visualization can be comprised with the circuit creation environment generated by the circuit component 112. For example, the sixth quantum state visualization can be comprised within the second panel 204 of the exemplary circuit creation environment 200. In one or more embodiments, the sixth quantum state visualization can be one or more Pauli vector diagrams.

Referring again to FIG. 1, the operations component 116 can compile and/or run a quantum computing program on one or more backend devices 107. For example, once a quantum computing program is developed in a circuit creation environment (e.g., generated by the circuit component 112), the operations component 116 can compile and/or run the subject quantum computing program on one or more backend devices 107. The operations component 116 can be operably coupled to the one or more backend devices 107 via a direct electrical connection and/or via the one or more networks 104.

In one or more embodiments, the operations component 116 can implement (e.g., compile and/or run) a subject quantum computing program on one or more of a plurality of backend devices 107. For example, the operations component 116 can implement the same quantum computing program on a variety of backend devices 107. Further, wherein the quantum computing program is developed in an ideal environment, the operations component 116 can generate one or more modifications to the quantum computing program to facilitate implementation on a selected backend device 107 (e.g., selected by a user of the system 100 via the one or more input devices 106). Additionally, wherein the quantum computing program is developed in a constrained environment, the operations component 116 can generate one or more modifications to the quantum computing program to facilitate implementation on a selected backend device 107 (e.g., a different backend device 107 than the quantum device initially accounted for by the quantum circuit configuration constraints of the circuit creation environment).

Figure 8A:
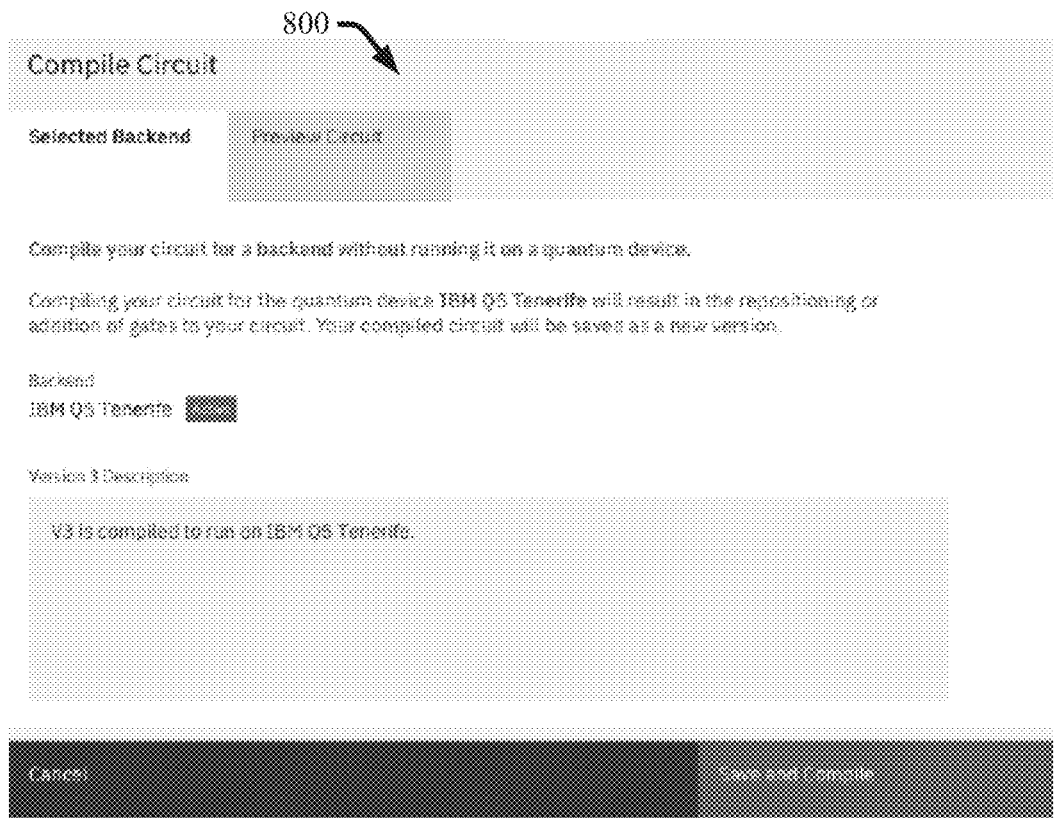
FIG. 8A illustrates a diagram of an example, non-limiting circuit creation environment that can be generated by one or more systems and can enable a user to compile a subject quantum computing program on one or more backend devices in accordance with one or more embodiments described herein.

FIG. 8A illustrates a diagram of an example, non-limiting first display 800 that can be generated by the operations component 116 in accordance with one or more embodiments described herein. Repetitive description of like elements employed in other embodiments described herein is omitted for sake of brevity. In one or more embodiments, a user of the system 100 can select a particular backend device 107 from a plurality of backend devices 107. For example, selection of a backend device 107 can be facilitated by a menu interface that can be included in the circuit creation environment (e.g., in the first panel 202 of the exemplary circuit creation environment 200) generated by the circuit component 112.

In one or more embodiments, a user of the system 100 can instruct the operations component 116 to compile a subject quantum computing program with regards to the selected backend device 107. FIG. 8A shows a first display 800 that can facilitate the user's selection of a backend device 107 and/or instruction for the operations component 116 to compile the subject quantum computing program. When compiling the quantum computing program, the operations component 116 can optimize the subject quantum circuit for the selected backend device 107 without running the quantum circuit. For example, during a compiling operation, the operations component 116 can generate one or more modifications to the quantum computing program (e.g., altering the configuration of the quantum circuit) to meet one or more operation restraints of the selected backend device 107.

Figure 8B:
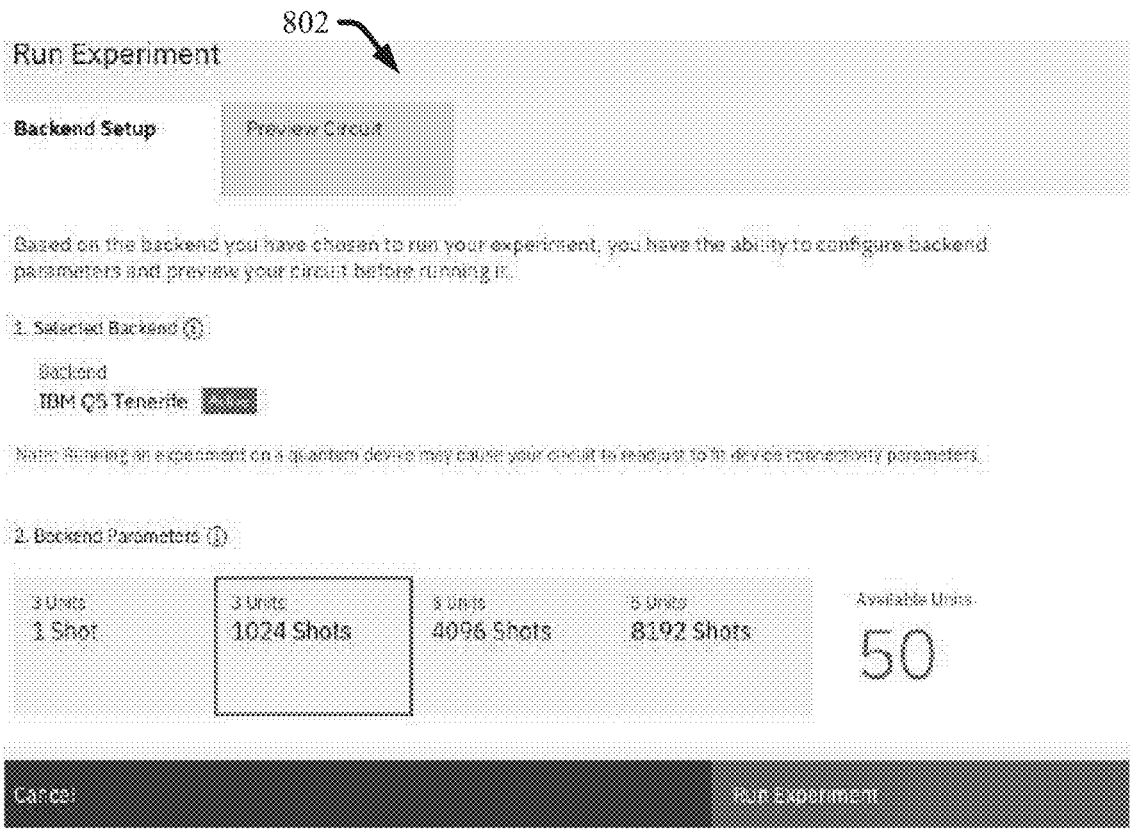
FIG. 8B illustrates a diagram of an example, non-limiting circuit creation environment that can be generated by one or more systems and can compile a subject quantum computing program on one or more backend devices in accordance with one or more embodiments described herein.

FIG. 8B illustrates a diagram of an example, non-limiting second display 802 that can be generated by the operations component 116 in accordance with one or more embodiments described herein. Repetitive description of like elements employed in other embodiments described herein is omitted for sake of brevity. In one or more embodiments, a user of the system 100 can select a particular backend device 107 from a plurality of backend devices 107. For example, selection of a backend device 107 can be facilitated by a menu interface that can be included in the circuit creation environment (e.g., in the first panel 202 of the exemplary circuit creation environment 200) generated by the circuit component 112.

In one or more embodiments, a user of the system 100 can instruct the operations component 116 to run the quantum computing program on the selected backend device 107. FIG. 8B shows a second display 802 that can facilitate the user's selection of a backend device 107 and/or instruction for the operations component 116 to run the subject quantum computing program. Additionally, as shown in FIG. 8B the operations component 116 can depict one or more parameters regarding the selected backend device 107 with regards to running the quantum computing program. Example backend device 107 parameters can include, but are not limited to: qubit connectivity, qubit error rates (e.g., regarding single and/or multi-qubits), coherence times, a number of times a quantum circuit is run in order to generate a probability histogram (e.g., wherein the histogram can be a result returned by the one or more backend devices 107), a combination thereof, and/or the like. When running the quantum computing program, the operations component 116 can optimize (e.g., via one or more modifications) the subject quantum circuit for the selected backend device 107 and subsequently run the modified quantum circuit. For example, during a run operation, the operations component 116 can generate one or more modifications to the quantum computing program (e.g., altering the configuration of the quantum circuit) to meet one or more operation restraints of the selected backend device 107. Thus, the operations component 116 can implement a subject quantum computing program on a plurality of respective backend devices 107. Advantageously, the operations component 116 allows to a user to develop a quantum computing program in a central circuit creation environment and then compile and/or run the quantum computing program on a variety of backend devices 107.

Additionally, the operations component 116 can generate one or more previews of the subject quantum computing program subsequent to modifications generated by the operations component 116 to meet one or more operation restrictions of a particular backend device 107. For example, wherein the operations component 116 generates one or more modifications to facilitate a compile operation and/or a run operation for a particular backend device 107, the operations component 116 can generate a preview display depicting the quantum computing program with the modifications. In one or more embodiments, the one or more modifications can be highlighted and/or otherwise indicated in the preview display by the operations component 116; thereby rendering the modifications conspicuous for user review. Moreover, in various embodiments, the one or more preview displays generated by the operations component 116 can be included in the circuit creation environment generated by the circuit component 112. By generating one or more preview displays, the operations component 116 can solve a problem exhibited by conventional systems in which a user must run and/or compile a quantum circuit unaware of one or more automated modifications.

Figure 9:
FIG. 9 illustrates a diagram of an example, non-limiting circuit creation environment that can be generated by one or more systems and can depict a preview of one or more automated modifications made to a subject quantum computing program in accordance with one or more embodiments described herein.

FIG. 9 illustrates an example, non-limiting first preview display 900 that can be generated by the operations component 116 to facilitate a user of the system 100 in identifying one or more modifications to a quantum circuit in accordance with one or more embodiments described herein. Repetitive description of like elements employed in other embodiments described herein is omitted for sake of brevity. One of ordinary skill in the art will recognize that a preview of the modified quantum circuit can be presented in a variety of formats.

For example, FIG. 9 shows an exemplary first preview display 900 that can be generated by the operations component 116, wherein the modified quantum circuit can be represented as a layout of icons representing various quantum features (e.g., the location and/or position of various quantum gates). As shown in FIG. 9, the modified quantum circuit can be displayed within the first preview display 900 alongside the originally developed quantum circuit (e.g., developed via the circuit component 112 in a circuit creation environment). Additionally, one or more modifications to the original quantum circuit can be delineated (e.g., highlighted) in the modified quantum circuit. The delineated modifications can represent one or more modifications generated by the operations component 116 to facilitate a compile and/or run operation of the quantum circuit on a selected backend device 107. Thus, one or more preview displays that can be generated by the operations component 116 (e.g., first preview display 900) can facilitate a user of the system 100 in identifying changes to a quantum circuit configuration conducted to facilitate proper operation on a selected backend device 107.

FIG. 10 illustrates an example, non-limiting second preview display 1000 that can be generated by the operations component 116 to facilitate a user of the system 100 in identifying one or more modifications to a quantum circuit in accordance with one or more embodiments described herein. Repetitive description of like elements employed in other embodiments described herein is omitted for sake of brevity. Similar to the first preview display 900, the second preview display 1000 is an exemplary preview display that can be generated by the operations component 116. Also, the second preview display 1000 can be included in a circuit creation environment generated by the circuit component 112.

The second preview display 1000 can also depict the original quantum circuit (e.g., developed in a circuit creation environment) alongside a modified version of the quantum circuit (e.g., the original quantum circuit including one or more modifications generated by the operations component 116 to meet one or more operation restrictions of a backend device 107). The second preview display 1000 exemplifies that the operations component 116 can depict the quantum circuits in a form other than the quantum circuit diagram view shown in the first preview display 900. For example, the operations component 116 can generate one or more preview displays in which the quantum circuits are shown as written code (e.g., as shown in FIG. 10). Further, the one or more modifications can be delineated in the preview display in each of the various formats used to depict the quantum circuits. For example, wherein the quantum circuits are depicted as written code (e.g., as shown in FIG. 10), the one or more lines of code comprising the one or more modifications can be highlighted and/or otherwise delineated (e.g., as shown in FIG. 10). In one or more embodiments, the operations component 116 can switch between presentation formats at a request of the user of the system 100. For instance, the operations component 116 can generate one or more preview displays in a circuit diagram view (e.g., the first preview display 900) and/or in a code view (e.g., the second preview display 1000). Advantageously, the one or more preview displays generated by the operations component 116 can enable a user of the system 100 to readily identify automated changes made to the subject quantum computing program.

Moreover, the operations component 116 can debug a quantum circuit before running and/or compiling the quantum computing program on a backend device 107. For example, the operations component 116 can generate one or more debug displays, which can depict the subject quantum circuit and/or one or more quantum state visualizations (e.g., generated by the visualization component 114) characterizing various portions of the quantum circuit. For example, the one or more debug displays generated by the operations component 116 can comprise one or more quantum state visualization generated by the visualization component 114, which can depict how one or more debug operations performed by the operations component 116 can affect the quantum circuit. In one or more embodiments, a user of the system 100 can direct the operations component 116 to debug a quantum computing program before running and/or compiling the quantum computing program on a backend device 107.

Figure 11:
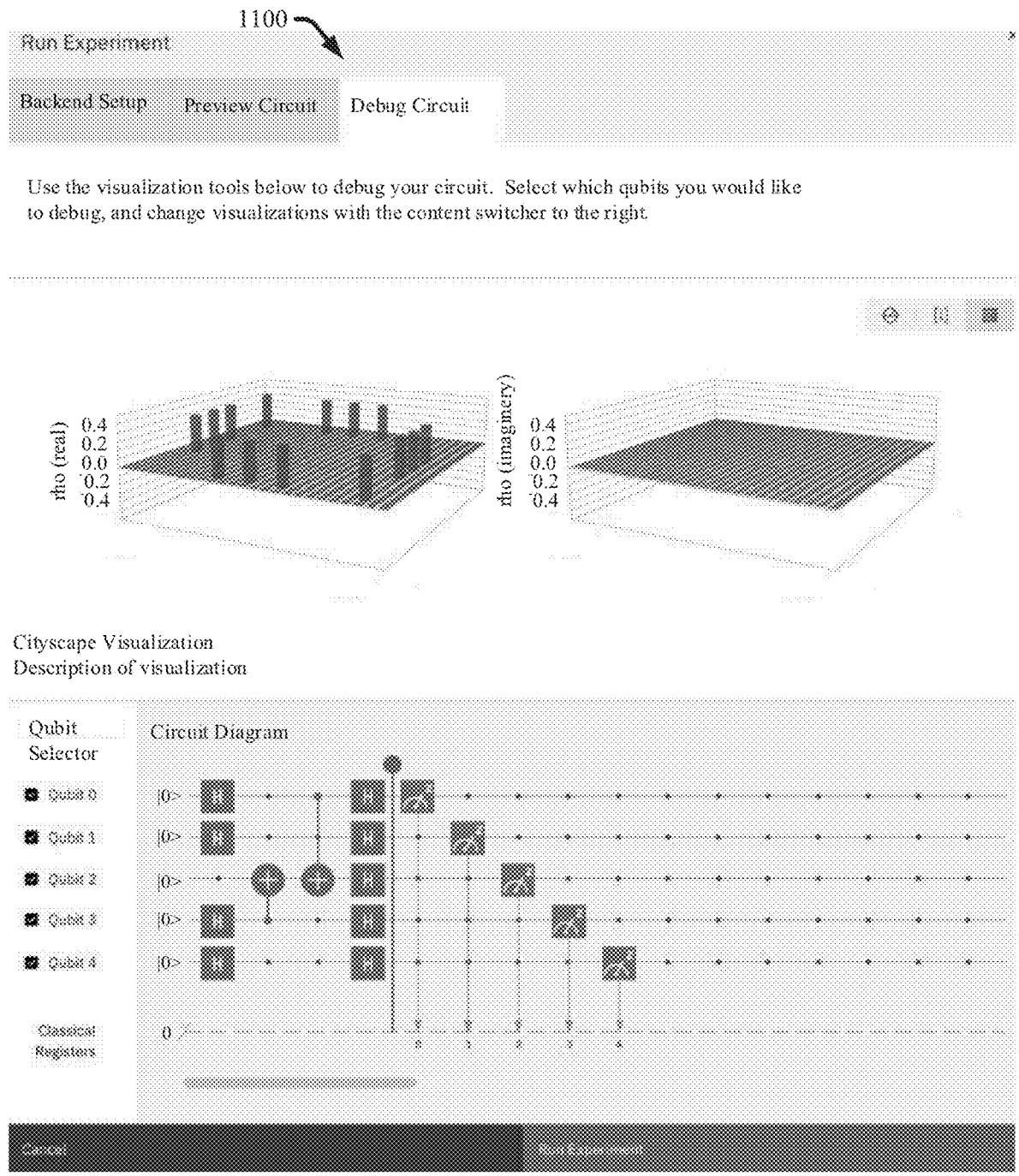
FIG. 11 illustrates a diagram of an example, non-limiting circuit creation environment that can be generated by one or more systems and can debug a subject quantum computing program in accordance with one or more embodiments described herein.

FIG. 11 illustrates a diagram of a non-limiting exemplary debug display 1100 that can be generated by the operations component 116 to facilitate one or more debugging operations of a subject quantum computing program in accordance with one or more embodiments described herein. Repetitive description of like elements employed in other embodiments described herein is omitted for sake of brevity. As shown in FIG. 11, the one or more debug displays generated by the operations component 116 (e.g., exemplary debug display 1100) can depict a configuration of a quantum computing device alongside one or more quantum state visualizations characterizing affects of the debugging operation. As described in various embodiments herein, the one or more quantum state visualizations can correlate to one or more indicators overlaid onto to the quantum circuit to identify the portion of the quantum circuit that is characterized by the one or more quantum state visualizations.

In one or more embodiments, a user of the system 100 can utilize the one or more debug displays (e.g., exemplary debug display 1100) to select one or more qubits in the quantum circuit for debugging by the operations component 116. Advantageously, the one or more quantum state visualizations can facilitate a user in identifying qubits for debugging.

Referring to FIG. 1, the results component 118 can generate one or more results displays based on one or more results returned by the one or more backend devices 107 after implementation of a quantum computing program by the operations component 116. The results component 118 can receive the results from the one or more backend devices 107 directly and/or through the reception component 110. For example, the results component 118 can be coupled to the one or more backend devices 107 via a direct electrical connection and/or via the one or more networks 104.

The results received by the results component 118 can describe, for example, how a quantum computing program functioned when implemented (e.g., by the operations component 116) on a backend device 107. The results can comprise data regarding, for example: execution statistics (e.g., the date and/or time of a run operation, the date and/or time of a returned result, and/or a runtime), statistics regarding a subject backend device 107 (e.g., the kind of backend device 107, the number of iterations performed, qubit connectivity, qubit errors, coherence times, quantum state visualizations for the subject quantum circuit, a representation of the subject quantum circuit (e.g., a circuit diagram of the quantum circuit and/or assembly language code of the quantum circuit), a combination thereof, and/or the like.

Figure 12:
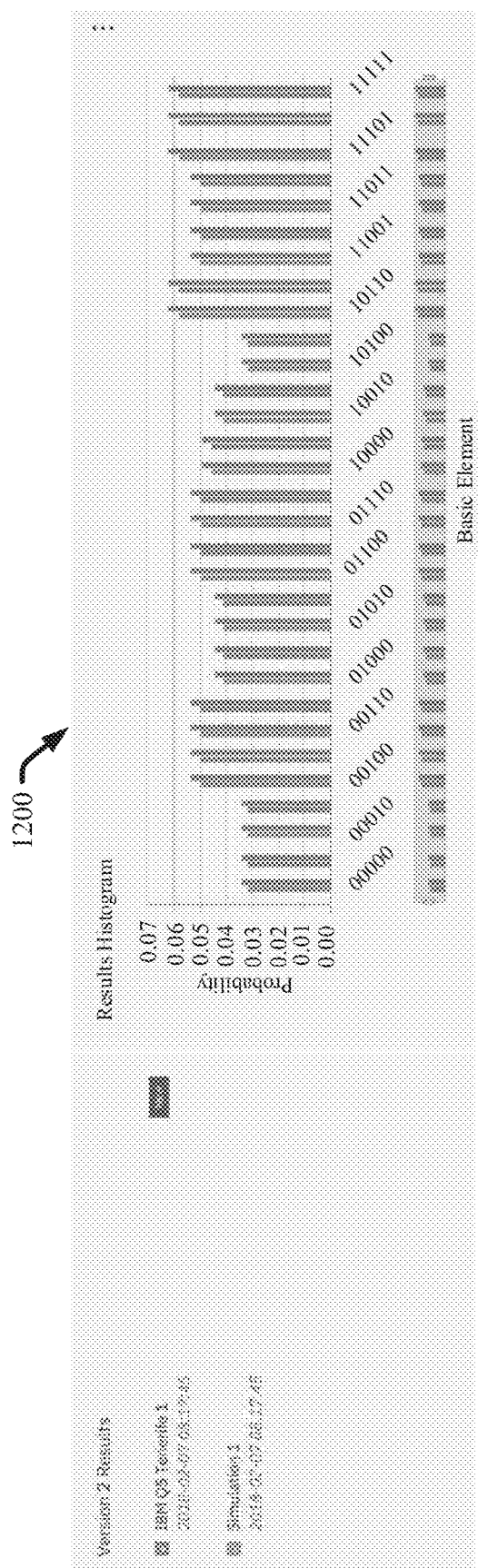
FIG. 12 illustrates a diagram of an example, non-limiting circuit creation environment that can be generated by one or more systems and can present one or more data sets characterizing an operation of a subject quantum computing program in accordance with one or more embodiments described herein.

FIG. 12 illustrates a diagram of a non-limiting exemplary results display 1200 that can depict one or more results with regards to a subject quantum computing program in accordance with one or more embodiments described herein. Repetitive description of like elements employed in other embodiments described herein is omitted for sake of brevity. In one or more embodiments, the one or more results displays (e.g., exemplary results display 1200) generated by the results component 118 can be comprised within a circuit creation environment generated by the circuit component 112. Also, the results component 118 can generate one or more results diagrams that depict the results as data, graphs, code, quantum state visualizations, quantum circuit diagrams, a combination thereof, and/or the like. In various embodiments, the one or more results displays (e.g., exemplary results display 1200) can be positioned alongside a depiction of the quantum circuit (e.g., in-line with the first panel 202 and/or the second panel 204 of the exemplary circuit creation environment 200).

In one or more embodiments, the results component 118 can generate one or more results displays to enable a user of the system 100 to download and/or view the results. Additionally, in various embodiments the one or more results displays can comprise results from various backend devices 107. For example, wherein a quantum computing program is implemented on multiple backend devices 107 (e.g., by the operations component 116), the results component 118 can generate one or more results displays that aggregate the respective results to facilitate a compare and/or contrast analysis of the performance of the quantum computing program on different backend devices 107. For instance, the results component 118 can overlay results returned from one backend device 107 onto results returned from one or more other backend devices 107. Thus, in one or more embodiments, the operations component 116 can implement a quantum circuit on a plurality of backend devices 107, wherein each respective backend device 107 can return one or more data sets of results describing a performance of the quantum circuit. The results component 118 can receive the respective data sets of results from the respective backend devices 107. Further, the results component 118 can generate one or more results displays based on the respective data sets of results. For example, respective data sets of results can be overlaid onto each other to facilitate a comparison of the performance of the quantum circuit on various backend devices 107. Moreover, the one or more generated results displays can comprise quantum state visualizations, execution statistics, and/or device error rates characterizing the respective results data sets.

Referring FIG. 1, the archive component 120 can store data regarding one or more quantum computing programs developed by the system 100, being developed by the system 100, implemented by the system 100, debugged by the system 100, and/or otherwise analyzed by the system 100. For example, the archive component 120 can save one or more quantum computing programs and/or data regarding the quantum computing programs in one or more experiment archives 128. The one or more experiment archives 128 can comprise one or more databases regarding developed quantum computing programs and/or quantum computing programs still being developed. The one or more experiment archives 128 can be located in the memory 122 (e.g., as shown in FIG. 1) and/or in a cloud computing environment (e.g., accessible by the control component 108 via the one or more networks 104). In one or more embodiments, the archive component 120 can store one or more past versions of one or more quantum computing programs, thereby enabling a user of the system 100 to readily practice version control with the quantum circuits and/or maintain a historical record of one or more quantum computing programs. Further, in various embodiments the archive component 120 can generate one or more archive displays to facilitate user control over and/or access to the one or more experiment archives 128. The one or more archive displays can be comprised within a circuit creation environment (e.g., generated by the circuit component 112). Alternatively, the one or more archives can be presented to a user of the system 100 independent of a circuit creation environment. By generating one or more archive displays and/or utilizing one or more experiment archives 128, the archive component 120 can solve a problem inherent with conventional developing quantum computing programs in which a user is not readily able to compare previously developed quantum circuits with recent and/or pending quantum circuits.

Figure 13:
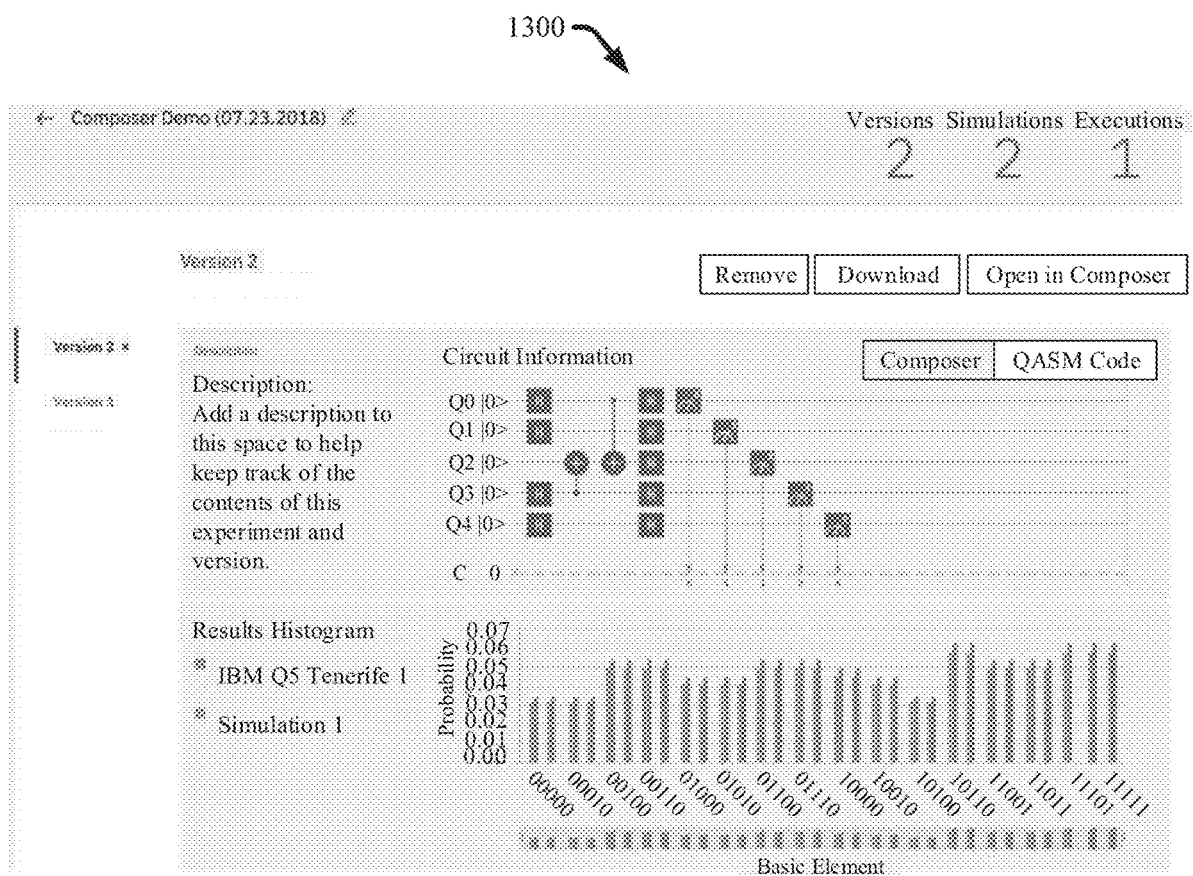
FIG. 13 illustrates a diagram of an example, non-limiting circuit creation environment that can be generated by one or more systems and can present one or more data sets characterizing an operation of a subject quantum computing program in accordance with one or more embodiments described herein.

FIG. 13 illustrates a diagram of a non-limiting exemplary archive display 1300 that can be generated by the archive component 120 in accordance with one or more embodiments described herein. Repetitive description of like elements employed in other embodiments described herein is omitted for sake of brevity. The archive component 120 can store one or more quantum computing programs in the one or more experiment archives 128, whereupon a user of the system 100 can utilize one or more archive displays generated by the archive component 120 to view stored quantum circuits and associated data (e.g., data sets of results returned for stored quantum circuits). Additionally, the one or more archive displays can enable a user to instruct the archive component 120 to retrieve past quantum computing programs for editing and/or review (e.g., in a circuit creation environment generated by the circuit component 112).

Further, as shown in FIG. 13, the one or more archive displays can comprise one or more summary pages (e.g., exemplary archive display 1300) regarding a stored quantum computing program. The one or more summary pages comprise quantum state visualizations and/or results returned for a stored quantum computing program. For example, the one or more summary pages (e.g., exemplary archive display 1300) can depict past experiment history of a subject quantum circuit and/or operation details from one or more backend devices 107 implementing the quantum circuit. Additionally, the archive component 120 can aggregate stored data regarding various versions of a subject quantum computing program so as to generate one or more archive displays that can enable a user to navigate between the versions.

One of ordinary skill in the art will readily recognize that the various displays that can be generated by the control component 108 in the various embodiments described herein (e.g., with regards to the description of FIGS. 2-13) can be presented in a variety of designs, aesthetics, and/or formats. Additionally, in various embodiments the one or more associate components of the control component 108 (e.g., reception component 110, circuit component 112, visualization component 114, operations component 116, results component 118, and/or archive component 120) can operate simultaneously and/or independent of each other to facilitate the features described herein.

FIG. 14 illustrates a flow diagram of an example, non-limiting method 1400 that can facilitate the development and/or analysis of one or more quantum computing programs by the system 100 in accordance with one or more embodiments described herein. Repetitive description of like elements employed in other embodiments described herein is omitted for sake of brevity.

At 1402, the method 1400 can comprise developing, by a system 100 (e.g., via the circuit component 112) operatively coupled to a processor 126, one or more quantum computing programs. For example, the circuit component 112 can facilitate development of the one or more quantum computing programs by generating one or circuit creation environments in accordance with the various embodiments described herein. For instance, the one or more quantum computing programs can be developed in an ideal environment or a constrained environment.

At 1404, the method 1400 can comprise implementing, by the system 100 (e.g., via the operations component 116), the one or more quantum computing programs on a plurality of backend devices 107 that can run the quantum computing program and return operational data to the system 100. For example, the one or more backend devices 107 can be simulators and/or quantum devices (e.g., quantum computers). Additionally, the implementing at 1404 can comprise a compile operation and/or a run operation. For instance, at 1404 the operations component 116 can implement a quantum computing program on both a simulator and a quantum computer (e.g., simultaneously).

FIG. 15 illustrates another flow diagram of an example, non-limiting method 1500 that can facilitate the development and/or analysis of one or more quantum computing programs by the system 100 in accordance with one or more embodiments described herein. Repetitive description of like elements employed in other embodiments described herein is omitted for sake of brevity.

At 1502, the method 1500 can comprise developing, by a system 100 (e.g., via the circuit component 112) operatively coupled to a processor 126, one or more quantum computing programs. For example, the circuit component 112 can facilitate development of the one or more quantum computing programs by generating one or circuit creation environments in accordance with the various embodiments described herein.

At 1504, the method 1500 can comprise modifying, by a system 100 (e.g., via the operations component 116), the one or more quantum computing programs in accordance with one or more operation restrictions of a quantum device (e.g., a backend device 107) to create one or more modified quantum computing programs. For example, the modifying at 1504 can comprise adding, subtract, repositioning, and/or relocating one or more features of the one or more subject quantum circuits (e.g., one or more quantum gates).

At 1506, the method 1500, can comprise displaying, by the system 100 (e.g., via the operations component 116), one or more modifications to the quantum computing program, wherein the modification can be generated by the system 100 to facilitate the modifying at 1504. For example, the displaying at 1506 can comprise generating (e.g., via the operations component 116) one or more preview displays in accordance with one or more embodiments described herein. For instance, the displaying at 1506 can comprise generating one or more preview displays that delineate the one or more modifications with respect to the initial, un-modified quantum computing program.

At 1508, the method 1500 can comprise implementing, by the system 100 (e.g., via the operations component 116), the one or more modified quantum computing programs on the quantum device (e.g., a backend device 107). For example, the implementing at 1508 can comprise compiling and/or running the modified quantum computing program on a quantum computer.

FIG. 16 illustrates another flow diagram of an example, non-limiting method 1600 that can facilitate the development and/or analysis of one or more quantum computing programs by the system 100 in accordance with one or more embodiments described herein. Repetitive description of like elements employed in other embodiments described herein is omitted for sake of brevity.

At 1602, the method 1600 can comprise implementing, by a system 100 (e.g., via the operations component 116) operatively coupled to a processor 126, a quantum computing program on one or more backend devices 107 that can return operational data regarding the quantum computing program to the system 100. The implementing at 1600 can comprise one or more compile operations and/or run operations. Also, the one or more backend devices 107 can comprise simulators and/or quantum computers.

At 1604, the method 1600 can comprise storing, by the system 100 (e.g., via the archive component 120), the operational data regarding the quantum computing program in a database archive (e.g., experiment archive 128). For example, the operational data can comprise respective data sets of results returned from the one or more backend devices 107.

FIG. 17 illustrates another flow diagram of an example, non-limiting method 1700 that can facilitate the development and/or analysis of one or more quantum computing programs by the system 100 in accordance with one or more embodiments described herein. Repetitive description of like elements employed in other embodiments described herein is omitted for sake of brevity.

At 1702, the method 1700 can comprise developing, by a system 100 (e.g., via the circuit component 112) operatively coupled to a processor 126, one or more quantum computing programs in a circuit creation environment (e.g., exemplary circuit creation environment 200). For example, the developing at 1702 can be facilitated by the circuit component 112 in accordance with one or more embodiments described herein. For instance, the circuit creation environment can be an ideal environment and/or a constrained environment.

At 1704, the method 1700 can comprise implementing, by the system 100 (e.g., via the operations component 116), the quantum computing program on one or more backend devices 107 that can return operational data regarding the quantum computing program to the system 100. The implementing at 1700 can comprise one or more compile operations and/or run operations. Also, the one or more backend devices 107 can comprise simulators and/or quantum computers.

At 1706, the method 1700 can comprise storing, by the system 100 (e.g., via the archive component 120), the operational data regarding the quantum computing program in a database archive (e.g., experiment archive 128). For example, the operational data can comprise respective data sets of results returned from the one or more backend devices 107.

At 1708, the method 1700 can comprise modifying, by the system 100 (e.g., via the circuit component 112), the quantum computing program to create a second quantum computing program. For example, the second quantum computing program can be a distinct version of the quantum computing program developed at 1702. In various embodiments, the quantum computing program developed at 1702 can be re-entered into a circuit creation environment (e.g., via the circuit component 112) to facilitate the modifying at 1708.

At 1710, the method 1700 can comprise generating, by the system 100 (e.g., via the one or more backend devices 107), additional operational data regarding the second quantum computing program. For example, the second quantum computing program can be compiled and/or run (e.g., via the operations component 116) on one or more backend devices 107 to facilitate the generating at 1710.

At 1712, the method 1700 can comprise storing, by the system 100 (e.g., via the archive component 120), the additional operational data regarding the second quantum computing program in the database archive (e.g., experiment archive 128). In various embodiments, the additional operational data can be aggregated (e.g., via the archive component 120) with the operational data stored at 1706 to generate a record of the various versions of the quantum computing programs. Thus, a historical record can be maintained (e.g., via the archive component 120) regarding the subject quantum computing program, the various versions of the quantum computing program, and the results of respective versions of the quantum computing program implemented on respective backend devices 107.

It is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 18:
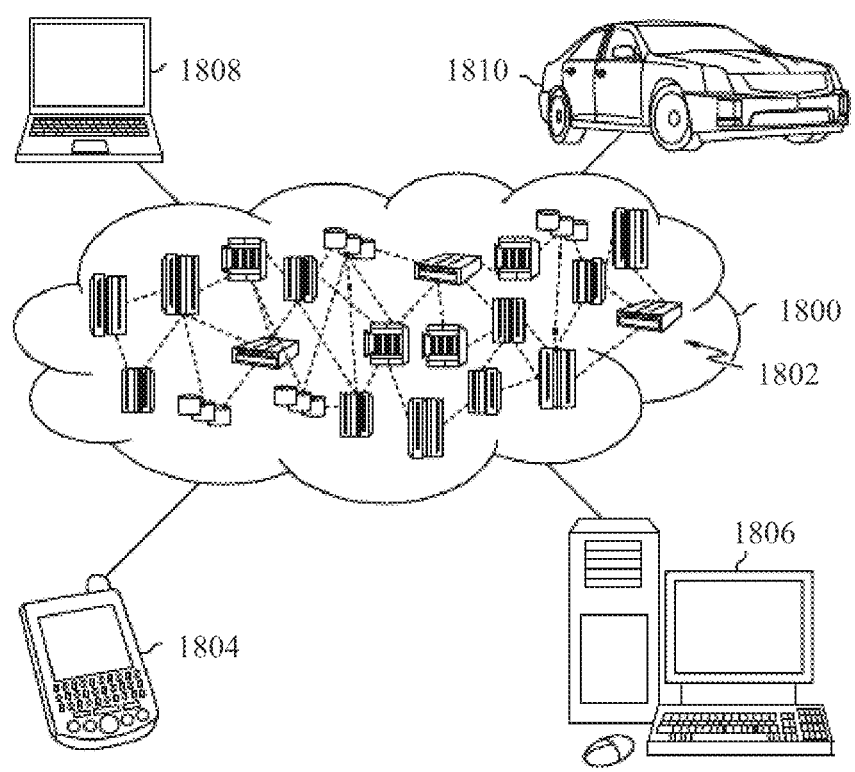
FIG. 18 depicts a cloud computing environment in accordance with one or more embodiments described herein.

Referring now to FIG. 18, illustrative cloud computing environment 1800 is depicted. As shown, cloud computing environment 1800 includes one or more cloud computing nodes 1802 with which local computing devices used by cloud consumers, such as, for example, personal digital assistant (PDA) or cellular telephone 1804, desktop computer 1806, laptop computer 1808, and/or automobile computer system 1810 may communicate. Nodes 1802 may communicate with one another. They may be grouped (not shown) physically or virtually, in one or more networks, such as Private, Community, Public, or Hybrid clouds as described hereinabove, or a combination thereof. This allows cloud computing environment 1800 to offer infrastructure, platforms and/or software as services for which a cloud consumer does not need to maintain resources on a local computing device. It is understood that the types of computing devices 1804-1810 shown in FIG. 18 are intended to be illustrative only and that computing nodes 1802 and cloud computing environment 1800 can communicate with any type of computerized device over any type of network and/or network addressable connection (e.g., using a web browser).

Figure 19:
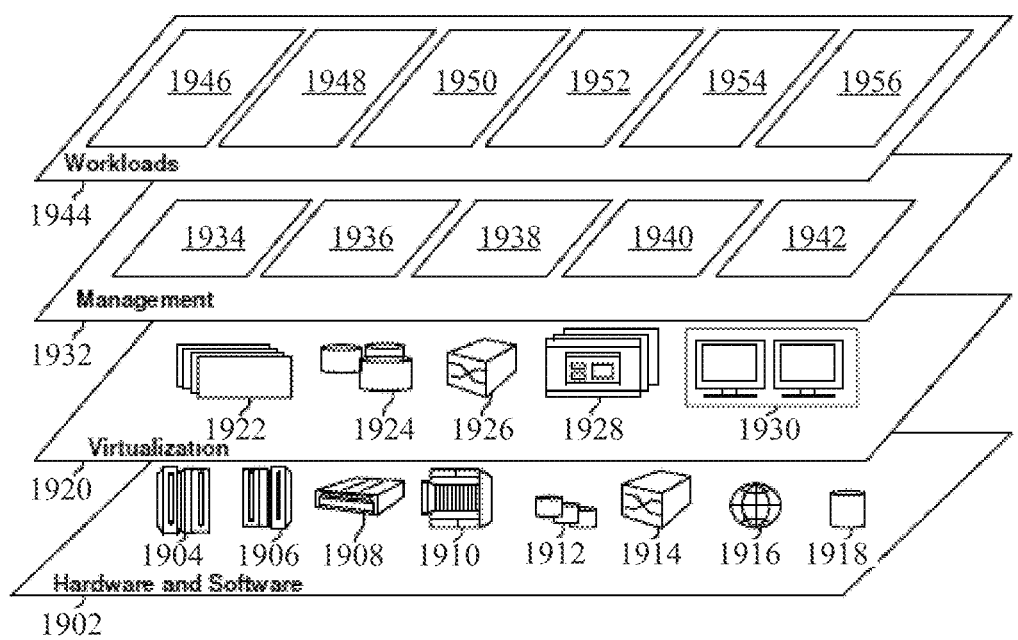
FIG. 19 depicts abstraction model layers in accordance with one or more embodiments described herein

Referring now to FIG. 19, a set of functional abstraction layers provided by cloud computing environment 1800 (FIG. 18) is shown. Repetitive description of like elements employed in other embodiments described herein is omitted for sake of brevity. It should be understood in advance that the components, layers, and functions shown in FIG. 19 are intended to be illustrative only and embodiments of the invention are not limited thereto. As depicted, the following layers and corresponding functions are provided.

Hardware and software layer 1902 includes hardware and software components. Examples of hardware components include: mainframes 1904; RISC (Reduced Instruction Set Computer) architecture based servers 1906; servers 1908; blade servers 1910; storage devices 1912; and networks and networking components 1914. In some embodiments, software components include network application server software 1916 and database software 1918.

Virtualization layer 1920 provides an abstraction layer from which the following examples of virtual entities may be provided: virtual servers 1922; virtual storage 1924; virtual networks 1926, including virtual private networks; virtual applications and operating systems 1928; and virtual clients 1930.

In one example, management layer 1932 may provide the functions described below. Resource provisioning 1934 provides dynamic procurement of computing resources and other resources that are utilized to perform tasks within the cloud computing environment. Metering and Pricing 1936 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1938 provides access to the cloud computing environment for consumers and system administrators. Service level management 1940 provides cloud computing resource allocation and management such that required service levels are met. Service Level Agreement (SLA) planning and fulfillment 1942 provide pre-arrangement for, and procurement of, cloud computing resources for which a future requirement is anticipated in accordance with an SLA.

Workloads layer 1944 provides examples of functionality for which the cloud computing environment may be utilized. Examples of workloads and functions which may be provided from this layer include: mapping and navigation 1946; software development and lifecycle management 1948; virtual classroom education delivery 1950; data analytics processing 1952; transaction processing 1954; and quantum computing program developing 1956. Various embodiments of the present invention can utilize the cloud computing environment described with reference to FIGS. 18 and 19 to facilitate in the development and/or analysis of one or more quantum computing programs.

The present invention may be a system, a method, and/or a computer program product at any possible technical detail level of integration. The computer program product may include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware based systems that perform the specified functions or acts or carry out combinations of special purpose hardware and computer instructions.

Figure 20:
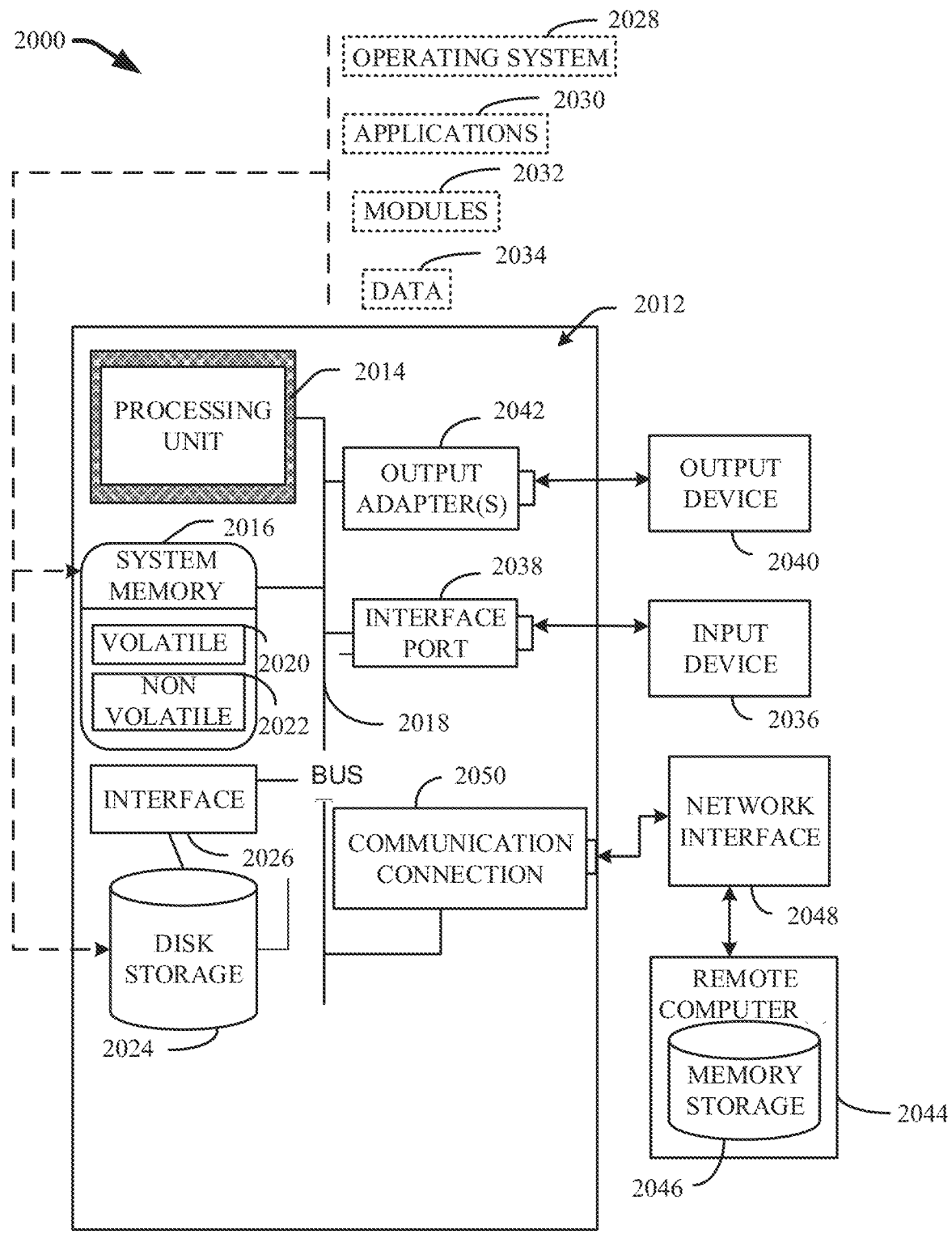
FIG. 20 illustrates a block diagram of an example, non-limiting operating environment in which one or more embodiments described herein can be facilitated.

In order to provide a context for the various aspects of the disclosed subject matter, FIG. 20 as well as the following discussion are intended to provide a general description of a suitable environment in which the various aspects of the disclosed subject matter can be implemented. FIG. 20 illustrates a block diagram of an example, non-limiting operating environment in which one or more embodiments described herein can be facilitated. Repetitive description of like elements employed in other embodiments described herein is omitted for sake of brevity. With reference to FIG. 20, a suitable operating environment 2000 for implementing various aspects of this disclosure can include a computer 2012. The computer 2012 can also include a processing unit 2014, a system memory 2016, and a system bus 2018. The system bus 2018 can operably couple system components including, but not limited to, the system memory 2016 to the processing unit 2014. The processing unit 2014 can be any of various available processors. Dual microprocessors and other multiprocessor architectures also can be employed as the processing unit 2014. The system bus 2018 can be any of several types of bus structures including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire, and Small Computer Systems Interface (SCSI). The system memory 2016 can also include volatile memory 2020 and nonvolatile memory 2022. The basic input/output system (BIOS), containing the basic routines to transfer information between elements within the computer 2012, such as during start-up, can be stored in nonvolatile memory 2022. By way of illustration, and not limitation, nonvolatile memory 2022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 2020 can also include random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 2012 can also include removable/non-removable, volatile/non-volatile computer storage media. FIG. 20 illustrates, for example, a disk storage 2024. Disk storage 2024 can also include, but is not limited to, devices like a magnetic disk drive, floppy disk drive, tape drive, Jaz drive, Zip drive, LS-100 drive, flash memory card, or memory stick. The disk storage 2024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 2024 to the system bus 2018, a removable or non-removable interface can be used, such as interface 2026. FIG. 20 also depicts software that can act as an intermediary between users and the basic computer resources described in the suitable operating environment 2000. Such software can also include, for example, an operating system 2028. Operating system 2028, which can be stored on disk storage 2024, acts to control and allocate resources of the computer 2012. System applications 2030 can take advantage of the management of resources by operating system 2028 through program modules 2032 and program data 2034, e.g., stored either in system memory 2016 or on disk storage 2024. It is to be appreciated that this disclosure can be implemented with various operating systems or combinations of operating systems. A user enters commands or information into the computer 2012 through one or more input devices 2036. Input devices 2036 can include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices can connect to the processing unit 2014 through the system bus 2018 via one or more interface ports 2038. The one or more Interface ports 2038 can include, for example, a serial port, a parallel port, a game port, and a universal serial bus (USB). One or more output devices 2040 can use some of the same type of ports as input device 2036. Thus, for example, a USB port can be used to provide input to computer 2012, and to output information from computer 2012 to an output device 2040. Output adapter 2042 can be provided to illustrate that there are some output devices 2040 like monitors, speakers, and printers, among other output devices 2040, which require special adapters. The output adapters 2042 can include, by way of illustration and not limitation, video and sound cards that provide a means of connection between the output device 2040 and the system bus 2018. It should be noted that other devices and/or systems of devices provide both input and output capabilities such as one or more remote computers 2044.

Computer 2012 can operate in a networked environment using logical connections to one or more remote computers, such as remote computer 2044. The remote computer 2044 can be a computer, a server, a router, a network PC, a workstation, a microprocessor based appliance, a peer device or other common network node and the like, and typically can also include many or all of the elements described relative to computer 2012. For purposes of brevity, only a memory storage device 2046 is illustrated with remote computer 2044. Remote computer 2044 can be logically connected to computer 2012 through a network interface 2048 and then physically connected via communication connection 2050. Further, operation can be distributed across multiple (local and remote) systems. Network interface 2048 can encompass wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). One or more communication connections 2050 refers to the hardware/software employed to connect the network interface 2048 to the system bus 2018. While communication connection 2050 is shown for illustrative clarity inside computer 2012, it can also be external to computer 2012. The hardware/software for connection to the network interface 2048 can also include, for exemplary purposes only, internal and external technologies such as, modems including regular telephone grade modems, cable modems and DSL modems, ISDN adapters, and Ethernet cards.

Embodiments of the present invention can be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device. Computer readable program instructions for carrying out operations of various aspects of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to customize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments where tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device including, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components including a memory. It is to be appreciated that memory and/or memory components described herein can be either volatile memory or nonvolatile memory, or can include both volatile and nonvolatile memory. By way of illustration, and not limitation, nonvolatile memory can include read only memory (ROM), programmable ROM (PROM), electrically programmable ROM (EPROM), electrically erasable ROM (EEPROM), flash memory, or non-volatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems, computer program products and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A system, comprising:
   a memory that stores computer executable components;
   a processor, operably coupled to the memory, and that executes the computer executable components stored in the memory, wherein the computer executable components comprise:
      a circuit component, operatively coupled to the processor, that creates multiple versions of a quantum computing program over a period of time based on modifying a circuit template to satisfy one or more respective constraints associated with one or more quantum devices on which the quantum computing program will execute; and
      a visualization component, operatively coupled to the processor, that generates a quantum state visualization that depicts a characterization of the multiple versions of the quantum computing program over the period of time.

2. The system of claim 1, wherein the characterization comprises a comparison view of at least two versions of the multiple versions of the quantum computing program.

3. The system of claim 1, wherein the visualization component updates the quantum state visualization based on respective modifications associated with the multiple versions of the quantum computing program, and wherein the quantum state visualization depicts the characterization at: a first time prior to a first modification within the period of time, a second time of the first modification within the period of time, and a third time a second modification within the period of time.

4. The system of claim 1, wherein the circuit component generates a first modification based on an operating constraint of a first quantum device of the one or more quantum devices, wherein the computer executable components further comprise an operations component, operatively coupled to the processor, that generates a preview display of a first version of the quantum computing program associated with the first modification, and wherein the preview display depicts the first modification.

5. The system of claim 1, wherein the quantum state visualization comprises a graphic selected from a group consisting of a Bloch sphere, a matrix representation, a quantum sphere, a Hinton plot, a cityscape diagram, and a Pauli vector diagram.

6. A system, comprising:
   a memory that stores computer executable components;
   a processor, operably coupled to the memory, and that executes the computer executable components stored in the memory, wherein the computer executable components comprise:
      a circuit component, operatively coupled to the processor, that generates a circuit creation environment to facilitate development of a quantum computing program; and a results component, operatively coupled to the processor, that generates a display concurrently depicting a first data set characterizing a first operation of a first version of the quantum computing program based on a first circuit modification generated in the circuit creation environment, and a second data set characterizing a second operation of a second version of the quantum computing program based on a second circuit modification generated in the circuit creation environment.

7. The system of claim 6, wherein the results component generates the display during the development of the quantum computing program.

8. The system of claim 6, wherein the display further comprises graphical elements that highlight differences between the first data set and the second data set.

9. The system of claim 6, wherein the circuit component generates the first circuit modification based on a first constraint associated with a first quantum device on which the first version of the quantum computing program is to execute, and generates the second circuit modification based on a second constraint associated with a second quantum device on which the second version of the quantum computing program is to execute.

10. The system of claim 6, further comprising:
an operations component, operatively coupled to the processor, that performs the first operation of the first version of the quantum computing program on a first quantum device and the second operation of the second version of the quantum computing program on a second quantum device.

11. A computer-implemented method, comprising:
developing, by a system operatively coupled to a processor, a quantum computing program;
implementing, by the system, the quantum computing program on a plurality of backend devices that execute the quantum computing program and return respective operational data associated with respective executions of the quantum computing program to the system;
displaying, by the system, a quantum state visualization that concurrently depicts respective characterizations of at least two of the respective operational data associated with respective executions of the quantum computing program by the plurality of backend devices.

12. The computer-implemented method of claim 11, wherein the plurality of backend devices comprises a first backend device and a second backend device, wherein the first backend device is distinct from the second backend device, and wherein the first backend device and the second backend device are selected from a group consisting of a simulator and a quantum computer.

13. The computer-implemented method of claim 11, comprising:
implementing, by the system, the quantum computing program on a first backend device from the plurality of backend devices, wherein the first backend device is a simulator; and
implementing, by the system, the quantum computing program on a second backend device from the plurality of backend devices, wherein the second backend device is a quantum computer.

14. The computer-implemented method of claim 11, further comprising:
modifying, by the system, the quantum computing program in accordance with an operation restriction of a quantum device to create a modified quantum computing program; and
implementing, by the system, the modified quantum computing program on a backend device from the plurality of backend devices, wherein the backend device is the quantum device.

15. The computer-implemented method of claim 14, further comprising:
displaying, by the system, a modification to the quantum computing program prior to the implementing the modified quantum computing program, wherein the modification is generated by the system to facilitate the modifying the quantum computing program.

16. A computer-implemented method, comprising:
implementing, by a system operatively coupled to a processor, a first version of a quantum computing program on a backend device that returns first operational data regarding the first version of the quantum computing program to the system; and
storing, by the system, the first operational data regarding the first version of the quantum computing program in a database archive; and
displaying, by the system, a quantum state visualization that concurrently depicts respective characterizations of the first operational data regarding the first version of the quantum computing program and second operational data regarding a second version of the quantum computing program.

17. The computer-implemented method of claim 16, wherein the backend device is selected from a group consisting of a simulator and a quantum computer.

18. The computer-implemented method of claim 16, wherein the database archive comprises additional operational data regarding additional versions of the quantum computing program.

19. The computer-implemented method of claim 16, further comprising:
modifying, by the system, the first version of the quantum computing program to create the second version of the quantum computing program;
generating, by the system, the second operational data regarding implementation of the second version of the quantum computing program the backend device; and
storing, by the system, the second operational data in the database archive.

20. The computer-implemented method of claim 16, further comprising:
developing, by the system, the first version and the second version of the quantum computing program in a circuit creation environment.

21. A computer program product for facilitating a construction of a quantum computing program, the computer program product comprising a computer readable storage medium having program instructions embodied therewith, the program instructions executable by a processor to cause the processor to:
develop, by a system operatively coupled to the processor, multiple versions of the quantum computing program based on modifying a circuit template over a period of time to satisfy one or more respective constraints associated with one or more quantum devices on which the quantum computing program will execute; and
generate, by the system, a quantum state visualization that depicts a characterization of the multiple versions of the quantum computing program over the period of time.

22. The computer program product of claim 21, wherein the characterization comprises a comparison view of at least two versions of the multiple versions of the quantum computing program.

23. The computer program product of claim 22, wherein the comparison view comprises respective operational data of the at least two versions of the multiple versions of the quantum computing program from execution by the one or more quantum devices.

24. The computer program product of claim 23, wherein the program instructions further cause the processor to:
   store, by the system, the respective operational data in a database archive.

25. The computer program product of claim 21, wherein the multiple versions of the quantum computing program is developed by the system via a cloud computing network.

* * * * *